United States Patent
Shimomura et al.

(10) Patent No.: US 7,795,111 B2
(45) Date of Patent: Sep. 14, 2010

(54) MANUFACTURING METHOD OF SOI SUBSTRATE AND MANUFACTURING METHOD OF SEMICONDUCTOR DEVICE

(75) Inventors: Akihisa Shimomura, Kanagawa (JP); Hidekazu Miyairi, Kanagawa (JP); Yurika Sato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/141,551

(22) Filed: Jun. 18, 2008

(65) Prior Publication Data

US 2009/0004821 A1    Jan. 1, 2009

(30) Foreign Application Priority Data

Jun. 27, 2007  (JP)  ............................. 2007-168666
Jun. 27, 2007  (JP)  ............................. 2007-168960

(51) Int. Cl.
*H01L 21/46* (2006.01)

(52) U.S. Cl. ....................... 438/455; 438/311; 438/458; 438/459; 438/513; 257/E21.317; 257/E21.32; 257/E21.561

(58) Field of Classification Search ................. 438/410, 438/513, 515, 517, 914, 923; 257/E21.317, 257/E21.319
See application file for complete search history.

(56) References Cited

U.S. PATENT DOCUMENTS

| | | | |
|---|---|---|---|
| 5,753,560 | A | 5/1998 | Hong et al. |
| 6,127,702 | A | 10/2000 | Yamazaki et al. |
| 6,271,101 | B1 | 8/2001 | Fukunaga |
| 6,335,231 | B1 | 1/2002 | Yamazaki et al. |
| 6,344,404 | B1 | 2/2002 | Cheung et al. |
| 6,380,007 | B1 | 4/2002 | Koyama |
| 6,388,652 | B1 | 5/2002 | Yamazaki et al. |
| 6,468,923 | B1 | 10/2002 | Yonehara et al. |
| 6,524,928 | B1 | 2/2003 | Hirabayashi |
| 6,548,382 | B1 * | 4/2003 | Henley et al. ................ 438/526 |
| 6,576,956 | B2 | 6/2003 | Kawanaka |
| 6,602,761 | B2 | 8/2003 | Fukunaga |
| 6,686,623 | B2 | 2/2004 | Yamazaki |
| 6,743,700 | B2 | 6/2004 | Asami et al. |
| 6,778,164 | B2 | 8/2004 | Yamazaki et al. |
| 6,803,264 | B2 | 10/2004 | Yamazaki et al. |

(Continued)

FOREIGN PATENT DOCUMENTS

EP    840367 A2    5/1998

(Continued)

*Primary Examiner*—Charles D Garber
*Assistant Examiner*—Cheung Lee
(74) *Attorney, Agent, or Firm*—Fish & Richardson P.C.

(57) ABSTRACT

An effect of metal contamination caused in manufacturing an SOI substrate can is suppressed. A damaged region is formed by irradiating a semiconductor substrate with hydrogen ions, and then, a base substrate and the semiconductor substrate are bonded to each other. Heat treatment is performed thereon to cleave the semiconductor substrate, so that an SOI substrate is manufactured. A gettering site layer is formed of a semiconductor containing a Group 18 element such as Ar, over a semiconductor layer of the SOI substrate. Heat treatment is performed thereon to perform gettering of a metal element in the semiconductor layer with the gettering site layer. By removing the gettering site layer by etching, thinning of the semiconductor layer can be performed.

54 Claims, 16 Drawing Sheets

U.S. PATENT DOCUMENTS

| | | |
|---|---|---|
| 6,808,968 B2 | 10/2004 | Takayama et al. |
| 6,875,633 B2 | 4/2005 | Fukunaga |
| 6,913,956 B2 | 7/2005 | Hamada et al. |
| 6,991,997 B2 | 1/2006 | Takayama et al. |
| 7,045,444 B2 | 5/2006 | Yamazaki et al. |
| 7,052,943 B2 | 5/2006 | Yamazaki et al. |
| 7,115,453 B2 | 10/2006 | Nakamura et al. |
| 7,119,365 B2 | 10/2006 | Takafuji et al. |
| 7,141,822 B2 | 11/2006 | Nakamura et al. |
| 7,148,124 B1 | 12/2006 | Usenko |
| 7,176,525 B2 | 2/2007 | Fukunaga |
| 7,232,742 B1 | 6/2007 | Maekawa |
| 7,256,776 B2 | 8/2007 | Yamazaki et al. |
| 7,316,947 B2 | 1/2008 | Yamazaki et al. |
| 7,446,016 B2 * | 11/2008 | Endo et al. ............ 438/455 |
| 2003/0036247 A1 | 2/2003 | Eriksen et al. |
| 2003/0183876 A1 | 10/2003 | Takafuji et al. |
| 2004/0097055 A1 * | 5/2004 | Henley et al. ............ 438/471 |
| 2004/0104424 A1 | 6/2004 | Yamazaki |
| 2005/0009252 A1 | 1/2005 | Yamazaki et al. |
| 2006/0063353 A1 * | 3/2006 | Akatsu ............ 438/455 |
| 2006/0281280 A1 * | 12/2006 | Endo et al. ............ 438/455 |
| 2007/0108510 A1 | 5/2007 | Fukunaga |
| 2007/0184632 A1 | 8/2007 | Yamazaki et al. |
| 2007/0281440 A1 | 12/2007 | Cites et al. |
| 2007/0291022 A1 | 12/2007 | Yamazaki et al. |
| 2008/0038908 A1 | 2/2008 | Henley |
| 2008/0246109 A1 | 10/2008 | Ohnuma et al. |
| 2008/0318367 A1 | 12/2008 | Shimomura et al. |
| 2009/0081849 A1 | 3/2009 | Yamazaki et al. |

FOREIGN PATENT DOCUMENTS

| | | |
|---|---|---|
| JP | 02-267950 A | 11/1990 |
| JP | 02-280380 A | 11/1990 |
| JP | 11-163363 | 6/1999 |
| JP | 2002-343799 A | 11/2002 |
| JP | 2004-087606 | 3/2004 |
| JP | 2005-252244 | 9/2005 |

* cited by examiner

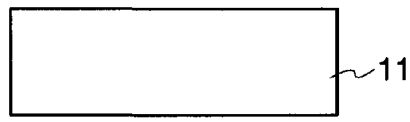
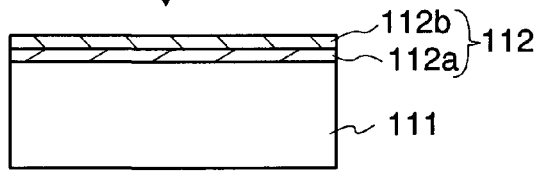
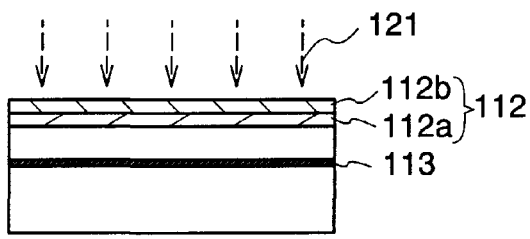
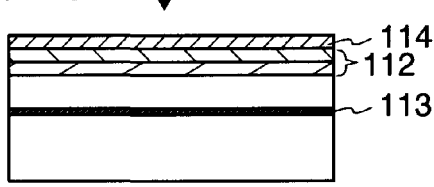
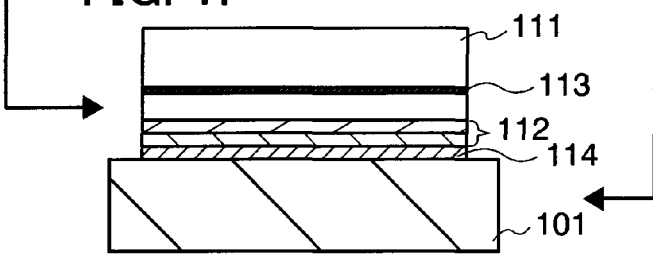
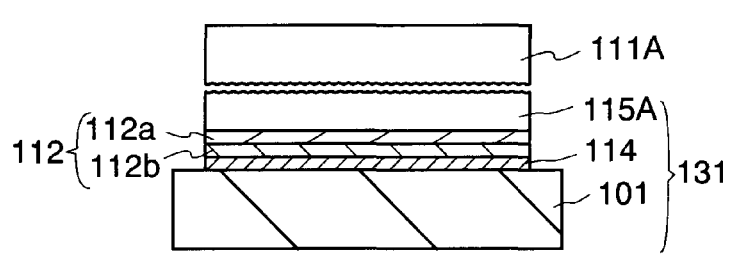

FIG.15

Concentration [Unit: atoms/cm$^2$]

| Sample / Element | Sample A | Comparative Sample X | Lower Detection Limit |
|---|---|---|---|
| Ti | $7.1 \times 10^{10}$ | Lower than lower detection limit | $3.1 \times 10^{10}$ |
| Zn | $6.3 \times 10^{11}$ | $4.0 \times 10^{10}$ | $2.3 \times 10^{10}$ |
| Mo | $2.8 \times 10^{12}$ | Lower than lower detection limit | $1.6 \times 10^{10}$ |
| Pb | $1.5 \times 10^{10}$ | Lower than lower detection limit | $7.3 \times 10^{9}$ |

MANUFACTURING METHOD OF SOI SUBSTRATE AND MANUFACTURING METHOD OF SEMICONDUCTOR DEVICE

BACKGROUND OF THE INVENTION

1. Field of the Invention

The present invention relates to a manufacturing method of an SOI (silicon on insulator) substrate having a semiconductor layer formed of silicon or the like and a method for manufacturing a semiconductor device by using the SOI substrate.

Note that the 'semiconductor device' in this specification refers to a device in general that can operate by utilizing semiconductor characteristics, and an electro-optical device, an integrated circuit, and an electronic device are all included in the category of the semiconductor device.

2. Description of the Related Art

Integrated circuits using an SOI substrate in which a thin single-crystal silicon layer is formed over an insulating layer have been developed. By utilizing characteristics of the thin single-crystal silicon layer, transistors in the integrated circuit can be formed so as to be completely isolated electrically for each element, and the transistors can be formed to be a full depletion type, so that a semiconductor integrated circuit with high added value such as high integration, high speed driving, and low power consumption can be realized.

As a method for manufacturing an SOI substrate, a bonding method in which a hydrogen ion implantation step and a separation process are combined with each other is known. In this method, an SOI substrate is manufactured mainly by the following process: hydrogen ions are implanted into a silicon wafer to form a damaged region at a predetermined depth from the surface; a silicon wafer which is to be a base substrate is oxidized so that a silicon oxide film is formed; the silicon wafer into which the hydrogen ions are implanted is bonded to the silicon wafer where the silicon oxide film is formed, whereby the two silicon wafers are attached to each other; heat treatment is performed thereon so that the bonded wafer is cleaved in the damaged region; and heat treatment is performed to improve bonding force of a silicon layer attached to the base substrate.

Further, methods in which an SOI substrate is manufactured by attaching a silicon layer, which has been separated from a silicon wafer, to a glass substrate are known (see Reference 1: Japanese Published Patent Application No. Hei11-163363, Reference 2: Japanese Published Patent Application No. 2004-087606, and Reference 3: Japanese Published Patent Application No. 2005-252244).

SUMMARY OF THE INVENTION

In a conventional manufacturing method of an SOI substrate, an ion implantation method is used to irradiate a silicon wafer with hydrogen ions. The ion implantation method is a method in which plasma is produced from a source gas, ion species contained in the plasma are extracted by an effect of an electric field, mass separation is performed thereon, and ion species having certain masses are accelerated and an object to be processed is irradiated with ion beams thereof. Further, there is an ion doping method as another method for irradiation with ions. The ion doping method is a method in which plasma is produced from a source gas, ion species are extracted from the plasma by an effect of an electric field, and the extracted ion species are accelerated without being subjected to mass separation and an object to be processed is irradiated with ion beams thereof.

By the study of this applicant, it was found that, by forming a damaged region by irradiating a silicon wafer with ion species produced from a hydrogen gas by the ion doping method, the silicon wafer can be cleaved by heat treatment at a lower temperature than the distortion temperature of a glass substrate. Based on this knowledge, an SOI substrate was manufactured by using a glass substrate having a distortion temperature of 700° C. or less as a base substrate and forming a damaged region by the ion doping method.

An ion doping apparatus for irradiation with ions by the ion doping method is an apparatus which was developed for manufacturing thin film transistors over a glass substrate with each side over one meter. Therefore, the ion doping method has an advantage in that the tact time for forming a damaged region can be reduced, over the ion implantation method in which mass separation is performed. However, in the ion doping method, a metal element contained in a material of an electrode or the like of an ion doping apparatus may be injected into a silicon wafer together with the hydrogen ions because mass separation is not performed. An SOI substrate contaminated by a metal causes decrease in electrical characteristics and reduction in reliability of a transistor, such as change of threshold voltage of a transistor and increase of leakage current.

It is an object of the present invention to provide a manufacturing method of an SOI in which an effect of contamination by a metal element can be suppressed. Further, it is another object of the present invention to provide a manufacturing method of a semiconductor device, in which an effect of metal contamination is suppressed and a semiconductor layer attached to a base substrate having a distortion temperature of 700° C. or less is used.

One feature of the present invention relates to a manufacturing method of a semiconductor device, in which an SOI substrate including a semiconductor layer separated from a semiconductor substrate and a base substrate to which the semiconductor layer is fixed is manufactured and a semiconductor element is formed from the semiconductor layer of the SOI substrate.

In order to manufacture an SOI substrate, ion species are produced by exciting a source gas, and a semiconductor substrate is irradiated with the ion species to form a damaged region in the semiconductor substrate. As the source gas, a hydrogen gas, a helium gas, or a halogen gas can be used.

A bonding layer for attaching the base substrate and the semiconductor substrate is formed over at least one of the base substrate and the semiconductor substrate. In the case of forming the bonding layer over the semiconductor substrate, the bonding layer may be formed after formation of the damaged region, or the damaged region may be formed after formation of the bonding layer.

The base substrate and the semiconductor substrate are made in close contact with each other with the bonding layer interposed therebetween so that a surface of the bonding layer and a surface in contact with the bonding layer are bonded; accordingly, the base substrate and the semiconductor substrate are attached to each other. The surface in contact with the bonding layer is, for example, a surface of the base substrate, a surface of the semiconductor substrate, or a surface of an insulating film.

After the base substrate and the semiconductor substrate are attached to each other, the damaged region is cracked by heating the semiconductor substrate, whereby the semiconductor substrate is divided. Accordingly, an SOI substrate in which the semiconductor layer separated from the semiconductor substrate is fixed to the base substrate is manufactured.

In the present invention, in order to remove a metal element of the semiconductor layer attached to the base substrate, a gettering site layer is formed over the semiconductor layer. After the formation of the gettering site layer, heat treatment for gettering of the metal element in the semiconductor layer with the gettering site layer is performed. This heat treatment can be performed, for example, at a temperature in the range of 450° C. to 850° C. both inclusive.

The gettering site layer can be formed of an amorphous semiconductor layer made of amorphous silicon, amorphous silicon-germanium, or the like. The gettering site layer includes one or more kinds of Group 18 elements selected from He, Ne, Ar, Kr, and Xe. It is preferable that the Group 18 element concentration of the gettering site layer be more than or equal to $1 \times 10^{18}$ atoms/cm$^3$ and less than or equal to $1 \times 10^{22}$ atoms/cm$^3$.

There are the following three methods for forming the gettering site layer. The first is a method in which a semiconductor is deposited by a CVD (chemical vapor deposition) method using a source gas containing at least a Group 18 element gas. The second is a method in which a semiconductor film is formed by a sputtering method using at least a Group 18 element gas in a process gas. The third is a method in which a semiconductor is deposited by a CVD method or a sputtering method and a Group 18 element is added into the semiconductor. The addition of the Group 18 element can be performed by an ion doping method or an ion implantation method.

After the heat treatment for gettering, the damaged region remaining over the semiconductor layer is removed together with the gettering site layer. Further, not only the damaged region but also an upper portion of the semiconductor layer may be removed to reduce the thickness of the semiconductor layer to a desired thickness. This step can be performed by etching treatment or polishing treatment. Further, this step may also be performed by both etching treatment and polishing treatment.

In the present invention, after the removal of the gettering site layer, the semiconductor layer is isolated for each element by etching or the like to form a semiconductor layer for forming a semiconductor element.

In the present invention, after the removal of the gettering site layer, the semiconductor layer can be irradiated with laser light. By the irradiation with laser light, crystal defects of the semiconductor layer can be reduced and the crystallinity can be improved. Further, after the irradiation with laser light, polishing treatment for polishing a surface of the semiconductor layer can be performed.

In the present invention, before the formation of the gettering site layer, the semiconductor layer attached to the base substrate can be irradiated with laser light. By the irradiation with laser light, crystal defects of the semiconductor layer can be reduced and the crystallinity can be improved.

Alternatively, in the present invention, in order to remove the metal element of the semiconductor layer attached to the base substrate, a Group 18 element is added into the semiconductor layer to form a gettering site region in an upper portion of the semiconductor layer, instead of forming the gettering site layer. After the formation of the gettering site region, heat treatment for gettering of the metal element in the semiconductor layer with the gettering site region is performed. This heat treatment can be performed, for example, at a temperature in the range of 450° C. to 850° C. both inclusive. The gettering site region is removed, and the semiconductor layer is isolated for each element by etching or the like to form a semiconductor layer for forming a semiconductor element.

Group 18 elements are He, Ne, Ar, Kr, and Xe. One or more kinds of the Group 18 elements can be added into the gettering site region. It is preferable that the Group 18 element concentration of the gettering site region be more than or equal to $1 \times 10^{18}$ atoms/cm$^3$ and less than or equal to $1 \times 10^{22}$ atoms/cm$^3$.

In the present invention, after the heat treatment for gettering, the gettering site region is removed to reduce the thickness of the semiconductor layer. Further, not only the gettering site region but also an upper portion of the semiconductor layer may be removed to reduce the thickness of the semiconductor layer to a desired thickness. This step can be performed by etching treatment or polishing treatment. Further, this step may also be performed by both etching treatment and polishing treatment.

In the present invention, after the removal of the gettering site region, the semiconductor layer can be irradiated with laser light. By the irradiation with laser light, crystal defects of the semiconductor layer can be reduced and therefore the crsyatllinity can be improved. After the irradiation with laser light, polishing treatment for polishing a surface of the semiconductor layer can be performed.

In the present invention, before the formation of the gettering site region, the semiconductor layer attached to the base substrate can be irradiated with laser light. By the irradiation with laser light, crystal defects of the semiconductor layer can be reduced and the crsyatllinity can be improved.

Since the gettering of a metal element with the gettering site layer or the gettering site region is performed in the present invention, an effect of metal contamination caused in a manufacturing process of a semiconductor device can be suppressed. Therefore, electrical characteristics and reliability of a transistor can be improved; for example, change of threshold voltage of a transistor can be suppressed and leakage current can be decreased.

Further, since an effect of metal contamination caused in a manufacturing process of an SOI substrate can be suppressed in the present invention, an ion doping apparatus with a fear of metal contamination can be positively used. Accordingly, tact time can be decreased by forming a damaged region with the ion doping apparatus.

Since the heat treatment for gettering a metal element with the gettering site layer or the gettering site region can be performed below the distortion temperature of a glass substrate, a glass substrate can be used as the base substrate to which the semiconductor layer is attached. Accordingly, a high-performance, highly reliable semiconductor device can be manufactured over a glass substrate.

BRIEF DESCRIPTION OF THE DRAWINGS

FIGS. 1A to 1G are cross-sectional views of a manufacturing method of an SOI substrate.

FIG. 15 is a table showing metal elements contained in a silicon oxynitride film and concentrations thereof, detected by ICP-MS.

DETAILED DESCRIPTION OF THE INVENTION

Figure 2A:
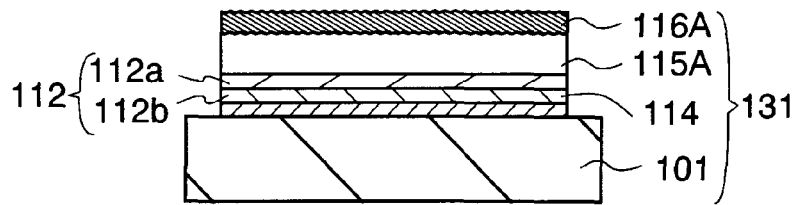
FIGS. 2A to 2E are cross-sectional views of a manufacturing method of an SOI substrate and show a process following FIG. 1G.

The present invention will be hereinafter described. The present invention can be implemented in various ways and it will be easily understood by those skilled in the art that various changes and modifications are possible unless such changes and modifications depart from the spirit and scope of the present invention. Thus, the present invention should not be construed as being limited to the following description of the embodiment modes. Further, the same portions are denoted by the same reference symbols through the drawings, and repetition explanation of materials, shapes, manufacturing methods, and the like is omitted.

Embodiment Mode 1

A method for manufacturing an SOI substrate will be described using FIGS. 1A to 1G, and 2A to 2E in this embodiment mode. FIGS. 1A to 1G, and 2A to 2E are cross-sectional views showing one example of a manufacturing method of an SOI substrate.

As shown in FIG. 1A, a base substrate 101 is prepared. The base substrate 101 is a support substrate for supporting a semiconductor layer separated from a semiconductor substrate. As the base substrate 101, a light-transmitting glass substrate used for electronics industry such as a liquid crystal display device can be used. In terms of heat resistance, cost, and the like, it is preferable to use a glass substrate having a coefficient of thermal expansion which is higher than or equal to $25 \times 10^{-7}/°C$. and lower than or equal to $50 \times 10^{-7}/°C$. (more preferably, higher than or equal to $30 \times 10^{-7}/°C$. and lower than or equal to $40 \times 10^{-7}/°C$.) and a distortion temperature which is higher than or equal to 580° C. and lower than or equal to 700° C. (more preferably, higher than or equal to 600° C. and lower than or equal to 680° C.). Furthermore, in order to suppress contamination of a semiconductor device, a non-alkali grass substrate is preferably used as the glass substrate. As examples of a material of the non-alkali glass substrate, there are glass materials such as aluminosilicate glass, aluminoborosilicate glass, and barium borosilicate glass.

As the base substrate 101, as well as the glass substrate, an insulating substrate made of an insulating material, such as a ceramic substrate, a quartz substrate, or a sapphire substrate; a conductive substrate made of a conductive material such as metal or stainless steel; a semiconductor substrate made of a semiconductor such as silicon, silicon germanium, silicon carbide, or gallium arsenide; or the like can be used.

As shown in FIG. 1B, a semiconductor substrate 111 is prepared. By attachment of a semiconductor layer, which is separated from the semiconductor substrate 111, to the base substrate 101, an SOI substrate is manufactured. As the semiconductor substrate 111, a single-crystal semiconductor substrate is preferably used. A polycrystalline semiconductor substrate can be used as well. As the semiconductor substrate 111, a semiconductor substrate including a Group 14 element such as silicon, germanium, silicon-germanium, or silicon carbide can be used. Note that, in this embodiment mode, a substrate which is larger than the semiconductor substrate 111 is used as the base substrate 101.

Then, as shown in FIG. 1C, an insulating layer 112 is formed over the semiconductor substrate 111. The insulating layer 112 can have a single-layer structure or a multilayer structure of two or more layers. The thickness of the insulating layer 112 can be set to be greater than or equal to 5 nm and less than or equal to 400 nm. As a film included in the insulating layer 112, an insulating film containing silicon or germanium as its component such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, the following can be used as well: an insulating film formed of a metal oxide such as aluminum oxide, tantalum oxide, or hafnium oxide; an insulating film formed of a metal nitride such as aluminum nitride; an insulating film formed of a metal oxynitride such as an aluminum oxynitride film; and/or an insulating film formed of a metal nitride oxide such as an aluminum nitride oxide film.

Note that, in this specification, the 'oxynitride' is a material in which the number of oxygen atoms is larger than the number of nitrogen atoms. Further, the 'nitride oxide' is a material in which the number of nitrogen atoms is larger than the number of oxygen atoms. The composition of the oxynitride or the nitride oxide can be measured by RBS (rutherford backscattering spectrometry) and HFS (hydrogen forward scattering). For example, silicon oxynitride includes oxygen in the range of 50 at. % to 65 at. % both inclusive, nitrogen in the range of 1 at. % to 20 at. % both inclusive, silicon in the range of 25 at. % to 35 at. % both inclusive, and hydrogen in the range of 0.1 at. % to 10 at. % both inclusive. Further, for example, silicon nitride oxide includes oxygen in the range of 5 at. % to 30 at. % both inclusive, nitrogen in the range of 20 at. % to 55 at. % both inclusive, silicon in the range of 25 at. % to 35 at. % both inclusive, and hydrogen in the range of 10 at. % to 30 at. % both inclusive. Note that the content ratio of oxygen, nitrogen, hydrogen, and silicon of each of the silicon oxynitride and the silicon nitride oxide described in this specification is a value when the total amount of elements included in each material is denoted as 100 at. %.

The insulating film included in the insulating layer 112 can be formed by a CVD method, a sputtering method, a method of oxidizing or nitriding the semiconductor substrate 111, or the like.

In the case where a substrate containing an impurity which reduces reliability of a semiconductor device such as an alkali metal or an alkaline earth metal is used as the base substrate 101, at least one layer of a film which can prevent such an impurity from diffusing from the base substrate 101 into a semiconductor layer of an SOI substrate is preferably included in the insulating layer 112. As such a film, a silicon nitride film, a silicon nitride oxide film, an aluminum nitride film, an aluminum nitride oxide film, or the like can be given. By including such a film, the insulating layer 112 can serve as a barrier layer.

For example, in the case where the insulating layer 112 is formed as a barrier layer with a single-layer structure, the insulating layer 112 can be formed of a silicon nitride film, a silicon nitride oxide film, an aluminum nitride film, or an aluminum nitride oxide film having a thickness greater than or equal to 5 nm and less than or equal to 200 nm.

In the case where the insulating layer 112 is formed as a barrier layer with a two-layer structure, an upper layer in the two-layer structure is formed of an insulating film having a high barrier function. The upper layer can be formed of a silicon nitride film, a silicon nitride oxide film, an aluminum nitride film, or an aluminum nitride oxide film having a thickness greater than or equal to 5 nm and less than or equal to 200 nm. Such a film has a high blocking effect for preventing impurity diffusion; however, the internal stress is high. Therefore, it is preferable that a film having an effect of relieving the stress of the upper-layer insulating film be selected as an insulating film which is a lower layer which is in contact with the semiconductor substrate 111. As such an insulating film, a silicon oxide film, a silicon oxynitride film, a thermally-oxidized film which is formed by thermally oxidizing the semiconductor substrate 111 or the like can be given. The thickness of the lower-layer insulating film can be set to be greater than or equal to 5 nm and less than or equal to 300 nm.

In this embodiment mode, the insulating layer 112 is formed of two layers of an insulating film 112a and an insulating film 112b. As for a combination of the insulating film 112a and the insulating film 112b in order to provide a function as a blocking film for the insulating layer 112, a silicon oxide film and a silicon nitride film, a silicon oxynitride film and a silicon nitride film, a silicon oxide film and a silicon nitride oxide film, a silicon oxynitride film and a silicon nitride oxide film, or the like can be given.

For example, as the lower-layer insulating film 112a, a silicon oxynitride film can be formed by a plasma CVD method using $SiH_4$ and $N_2O$ as a source gas. As the upper-layer insulating film 112b, a silicon nitride oxide film can be formed by a plasma CVD method using $SiH_4$, $N_2O$, and $NH_3$ as a source gas. Note that, as the insulating film 112a, a silicon oxide film can also be formed by a plasma CVD method using an organic silane gas and oxygen as a source gas.

As examples of the organic silane gas, the following compounds can be given: tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$), and the like.

Next, as shown in FIG. 1D, implantation of (irradiation with) an ion beam 121 including ions accelerated by application of an electric field is performed on the semiconductor substrate 111 through the insulating layer 112, so that a damaged region 113 is formed in the semiconductor substrate 111. This ion irradiation step is a step of adding an element included in ion species into the semiconductor substrate 111 by irradiating the semiconductor substrate 111 with the ion beam 121 including the accelerated ion species. Thus, when the semiconductor substrate 111 is irradiated with the ion beam 121, a fragile layer whose crystal structure becomes fragile is formed at a predetermined depth in the semiconductor substrate 111 by shock of the accelerated ion species. This layer is the damaged region 113. The depth of the region where the damaged region 113 is formed can be controlled by the acceleration energy of the ion beam 121 and the injection angle of the ion beam 121. The acceleration energy can be controlled by an acceleration voltage, a dosage, or the like. The damaged region 113 is formed in a region at a depth almost equal to the average depth of injected ions. That is, the thickness of a semiconductor layer which is separated from the semiconductor substrate 111 can be determined by the injection depth of ions. The depth where the damaged region 113 is formed is greater than or equal to 50 nm and less than or equal to 500 nm, and preferably greater than or equal to 50 nm and less than or equal to 200 nm.

The irradiation of the semiconductor substrate 111 with the ion beam 121 can be performed by either an ion implantation method in which mass separation is performed or an ion doping method in which mass separation is not performed.

In the case where hydrogen ($H_2$) is used for a source gas, a hydrogen gas is excited, so that $H^+$, $H_2^+$, and $H_3^+$ can be produced. Proportions of ion species produced from a source gas can be changed by controlling an excitation method of plasma, a pressure of an atmosphere for producing plasma, a supply of the source gas, or the like. In the case where the ion irradiation is performed by an ion doping method, it is preferable that $H_3^+$ be contained at 70% or more with respect to the total amount of $H^+$, $H_2^+$, and $H_3^+$ in the ion beam 121, and it is more preferable that the proportion of $H_3^+$ be 80% or more. By containing $H_3^+$ at 70% or more, the proportion of $H_2^+$ ions contained in the ion beam 121 becomes relatively small and variation in average depth of injection of the hydrogen ions contained in the ion beam 121 is reduced, so that injection efficiency of ions can be improved and the tact time can be shortened.

In order to form the damaged region 113 in a region at a small depth, the acceleration voltage of ions needs to be low. By increasing the proportion of $H_3^+$ ions in plasma produced by excitation of a hydrogen gas, atomic hydrogen (H) can be efficiently added into the semiconductor substrate 111. This is because an $H_3^+$ ion has mass which is three times as large as that of an $H^+$ ion, and, when hydrogen atoms are added into a region at the same depth, the acceleration voltage of the $H_3^+$ ion can be three times as high as that of the $H^+$ ion. When the acceleration voltage of ions can be higher, tact time of an ion irradiation step can be shortened, and productivity and throughput can be improved. Therefore, by increasing the proportion of $H_3^+$ ions included in the ion beam 121, variation in the average depth of injected ions is decreased; accordingly, in the semiconductor substrate 111, the in-depth concentration profile of hydrogen becomes sharper and the peak of the profile can be positioned at a small depth.

In the case where the ion irradiation is performed by an ion doping method using a hydrogen gas, the acceleration voltage can be set to be greater than or equal to 10 kV and less than or equal to 200 kV and the dosage can be set to be greater than or equal to $1 \times 10^{16}$ ions/cm$^2$ and less than or equal to $6 \times 10^{16}$ ions/cm$^2$. By irradiation with the hydrogen ions in this condition, the damaged region 113 can be formed in a region at a depth greater than or equal to 50 nm and less than or equal to 500 nm in the semiconductor substrate 111, though depending on the ion species and proportion thereof included in the ion beam 121.

For example, in the case where the semiconductor substrate 111 is a single-crystal silicon substrate, the insulating film 112a is a 50-nm-thick silicon oxynitride film, and the insulating film 112b is a 50-nm-thick silicon nitride oxide film, a semiconductor layer with a thickness of about 120 nm can be separated from the semiconductor substrate 111 in the following condition; a source gas is hydrogen, the acceleration voltage is 40 kV, and the dosage is $2\times10^{16}$ ions/cm$^2$. Alternatively, in the case where the insulating film 112a is a 100-nm-thick silicon oxynitride film and irradiation with hydrogen ions are performed under the above-described condition except that the insulating film 112a is the 100-nm-thick silicon oxynitride film, a semiconductor layer with a thickness of about 70 nm can be separated from the semiconductor substrate 111.

Helium (He) can also be used as the source gas in the ion irradiation step. Most of the ion species produced by excitation of helium are He$^+$; therefore, the semiconductor substrate 111 can be irradiated with He$^+$ as main ions even by an ion doping method in which mass separation is not performed. Accordingly, a microvoid can be formed efficiently in the damaged region 113 by an ion doping method. In the case where the ion irradiation is performed by an ion doping method using helium, the acceleration voltage can be set to be greater than or equal to 10 kV and less than or equal to 200 kV and the dosage can be set to be greater than or equal to $1\times10^{16}$ ions/cm$^2$ and less than or equal to $6\times10^{16}$ ions/cm$^2$.

A halogen gas such as a chlorine gas (Cl$_2$ gas) or a fluorine gas (F$_2$ gas) can also be used as the source gas.

After the formation of the damaged region 113, a bonding layer 114 is formed over a top surface of the insulating layer 112 as shown in FIG. 1E. In the step of forming the bonding layer 114, the heat temperature of the semiconductor substrate 111 is set at a temperature at which an element or molecule added into the damaged region 113 is not separated out, and the heat temperature is preferably 350° C. or lower. In other words, the heat temperature is set at a temperature at which degassing from the damaged region 113 does not occur. Note that the bonding layer 114 can be formed before the ion irradiation step is carried out, as well. In this case, the process temperature for forming the bonding layer 114 can be set at 350° C. or higher.

The bonding layer 114 is a layer for forming a smooth, hydrophilic bonding plane on the semiconductor substrate 111. Therefore, as for surface roughness of the bonding layer 114, it is preferable that an average roughness Ra be less than 0.8 nm and a root-mean-square roughness Rms be less than 0.9 nm. Further, the thickness of the bonding layer 114 can be set to be greater than or equal to 5 nm and less than or equal to 500 nm, and the thickness is preferably greater than or equal to 10 nm and less than or equal to 200 nm.

As the bonding layer 114, an insulating film formed by chemical reaction is preferable, and a silicon oxide film is preferable. In the case where a silicon oxide film is formed by a plasma CVD method as the bonding layer 114, an organic silane gas and an oxygen (O$_2$) gas are preferably used as a source gas. By using organic silane for the source gas, a silicon oxide film having a smooth surface can be formed at a process temperature which is equal to or lower than 350° C. Further, the bonding layer 114 can also be formed of a low temperature oxide (LTO) which is formed at a heat temperature which is equal to or lower than 500° C. and equal to or higher than 200° C. by a thermal CVD method. In order to form the LTO, monosilane (SiH$_4$), disilane (Si$_2$H$_6$), or the like can be used as a silicon source gas, and dinitrogen monoxide (N$_2$O) or the like can be used as an oxygen source gas.

Note that, in the case where a semiconductor substrate is used as the base substrate 101, the bonding layer 114 can be formed of an oxide film by oxidizing the semiconductor substrate 111 without forming the insulating layer 112, as well.

FIG. 1F is a cross-sectional view of a bonding step, which shows a state where the base substrate 101 and the semiconductor substrate 111 are attached to each other. When the bonding step is preformed, ultrasonic cleaning is performed on the base substrate 101 and the semiconductor substrate 111 provided with the bonding layer 114 and the insulating layer 112, first. As the ultrasonic cleaning, megahertz ultrasonic cleaning (megasonic cleaning) is preferable. After the megahertz ultrasonic cleaning, it is preferable to clean at least one of the base substrate 101 and the semiconductor substrate 111 with ozone water. By cleaning with ozone water, an organic matter can be removed and the surface hydrophilicity can be improved.

After the cleaning step, the base substrate 101 and the semiconductor substrate 111 are attached to each other with the bonding layer 114 interposed therebetween. First, Van der Waals force acts on an interface between the bonding layer 114 and the base substrate 101. By addition of force so that the surface of the base substrate 101 and the surface of the bonding layer 114 have a close contact with each other, a chemical bond is formed at the interface between the base substrate 101 and the bonding layer 114, whereby the base substrate 101 and the bonding layer 114 are bonded to each other. Since the bonding step does not need heat treatment and can be performed at room temperature, a substrate with low heat resistance, such as a glass substrate, can be used as the base substrate 101.

After making the base substrate 101 and the semiconductor substrate 111 have a close contact with each other, it is preferable to perform heat treatment to increase bonding force at the bonding interface between the base substrate 101 and the bonding layer 114. The heat treatment is performed at a temperature at which the damaged region 113 does not crack; the temperature can be set to be equal to or higher than 70° C. and equal to or lower than 300° C.

Then, heat treatment is performed at a temperature which is equal to or higher than 400° C. to divide the semiconductor substrate 111 in the damaged region 113, so that a semiconductor layer 115A is separated from the semiconductor substrate 111. Using FIG. 1G, the separation step of separating the semiconductor layer 115A from the semiconductor substrate 111 is explained. As shown in FIG. 1G, the semiconductor layer 115A is provided over the base substrate 101 by the separation step. Reference symbol 111A denotes the semiconductor substrate 111 after the semiconductor layer 115A is separated.

Through the heat treatment at 400° C. or higher, the bonding force of the bonding between the base substrate 101 and the bonding layer 114 is increased. As the temperature rises, the elements added in the ion irradiation step are separated out in microvoids formed in the damaged region 113, and internal pressure increases. As the damaged region 113 cracks, whereby the semiconductor substrate 111 is cleaved along the damaged region 113. Since the bonding layer 114 is bonded to the base substrate 101, the semiconductor layer 115A separated from the semiconductor substrate 111 is fixed onto the base substrate 101. The temperature for the heat treatment for separating the semiconductor layer 115A from the semiconductor substrate 111 is set in the range of 400° C. to 700° C. both inclusive so as not to exceed a distortion temperature of the base substrate 101.

Through the separation step shown in FIG. 1G, an SOI substrate 131 in which the semiconductor layer 115A is attached to the base substrate 101 is manufactured. The SOI substrate 131 has a multilayer structure in which the bonding layer 114, the insulating layer 112, and the semiconductor layer 115A are stacked in this order over the base substrate 101, in which the base substrate 101 and the bonding layer 114 are bonded to each other. In the case where the insulating layer 112 is not formed, the SOI substrate 131 is a substrate in which the bonding layer 114 and the semiconductor layer 115A are in contact with each other.

Note that the heat treatment for separating the semiconductor layer 115A from the semiconductor substrate 111 can be performed successively with the same apparatus as that used in the heat treatment for strengthening the bonding force. Alternatively, the two heat treatment can be performed with different apparatuses. For example, in the case of using the same furnace, the two treatment are performed as follows: (1) heat treatment is performed at 200° C. for 2 hours, (2) the heat temperature is increased to 600° C. and heat treatment is performed at 600° C. for 2 hours, and (3) the temperature is decreased to be in the range of about 400° C. to room temperature both inclusive and the semiconductor substrate 111A and the SOI substrate 131 are taken out from the furnace.

In the case of performing the two heat treatment with different apparatuses, the two heat treatment is performed as follows, for example: heat treatment is performed at 200° C. for 2 hours in a furnace and then the base substrate 101 and the semiconductor substrate 111 which are attached to each other are taken out from the furnace; and next, heat treatment is performed at a temperature which is equal to or higher than 600° C. and equal to or lower than 700° C. for 1 to 30 minutes in a rapid thermal annealing (RTA) apparatus, so that the semiconductor substrate 111 is divided in the damaged region 113.

Using FIGS. 2A to 2E, a method for gettering metal impurities from the semiconductor layer 115A in the SOI substrate 131 will be described.

First, a gettering site layer 116A is formed over the semiconductor layer 115A. FIG. 2A is a cross-sectional view for describing the step of forming the gettering site layer 116A. There are roughly two methods as the method for forming the gettering site layer 116A. One is a method in which a Group 18 element is added while forming a semiconductor film by a CVD method, a sputtering method, or the like. The other is a method in which a semiconductor film is formed by a CVD method, a sputtering method, or the like and then a Group 18 element is added into the semiconductor film by an ion doping method or an ion implantation method.

The gettering site layer 116A is preferably formed after a natural oxide film on the semiconductor layer 115A is removed. For example, the natural oxide film can be removed by etching the surface of the semiconductor layer 115A by using an etchant containing hydrofluoric acid.

The crystal structure of the gettering site layer 116A is preferably an amorphous structure. The gettering site layer 116A can be formed of an amorphous silicon layer or an amorphous silicon-germanium layer. The gettering site layer 116A includes one or more kinds of Group 18 elements selected from He, Ne, Ar, Kr, and Xe.

It is preferable that the Group 18 element concentration of the gettering site layer be equal to or more than $1\times10^{18}$ atoms/cm$^3$ and less than or equal to $1\times10^{22}$ atoms/cm$^3$, and it is more preferable that the Group 18 element concentration of the gettering site layer be equal to or more than $1\times10^{20}$ atoms/cm$^3$ and less than or equal to $5\times10^{21}$ atoms/cm$^3$. The Group 18 element concentration of the gettering site layer can be analyzed by SIMS (secondary ion mass spectrometry). The Group 18 element is contained in the gettering site layer 116A so that the peak concentration is greater than or equal to $1\times10^{18}$ atoms/cm$^3$ and less than or equal to $1\times10^{22}$ atoms/cm$^3$ in an in-depth profile of the Group 18 element analyzed by SIMS, and is preferably greater than or equal to $1\times10^{20}$ atoms/cm$^3$ and less than or equal to $5\times10^{21}$ atoms/cm$^3$.

For example, in the case where an amorphous silicon film containing Ar is formed by a plasma CVD method, monosilane (SiH$_4$), hydrogen (H$_5$), and argon (Ar) are used as a source gas. In the source gas, the flow ratio of SiH$_4$ to Ar, SiH$_4$/Ar, is preferably greater than or equal to 1/999 and greater than or equal to 1/9. Further, process temperature is preferably equal to or higher than 300° C. and equal to or lower than 500° C. RF power density for excitation of the source gas is preferably greater than or equal to 0.0017 W/cm$^2$ and less than or equal to 0.48 W/cm$^2$. Process pressure is preferably greater than or equal to 1.333 Pa and less than or equal to 66.65 Pa.

For example, in the case where an amorphous silicon film containing Ar is formed by a sputtering method, single-crystal silicon is used as a target and argon (Ar) is used as a process gas. By grow discharge of the Ar gas and sputtering of the single-crystal silicon target is performed with Ar ions, the amorphous silicon film containing Ar can be formed. The Ar concentration in the amorphous silicon film can be controlled by power, pressure, temperature, or the like for the grow discharge. Process pressure is preferably greater than or equal to 0.1 Pa and less than or equal to 5 Pa. As the pressure is decreased, the Ar concentration in the amorphous silicon film can be increased; therefore, the pressure is preferably equal to or lower than 1.5 Pa. It is not particularly necessary to heat the base substrate 101 in this process and process temperature is preferably equal to or lower than 300° C.

As the sputtering method, an RF sputtering method or a DC sputtering method can be used. The Ar concentration in the amorphous silicon film can become greater than or equal to $1\times10^{20}$ atoms/cm$^3$ more easily by the RF sputtering method than by the DC sputtering method. In the case of the RF sputtering method, the Ar concentration in the film can be increased as the RF power density for glow discharge is decreased. RF power density is preferably greater than or equal to 0.137 W/cm$^2$ and less than or equal to 6.847 W/cm$^2$. This is because the RF power is set to greater than or equal to 0.1 kW and less than or equal to 5 kW in the case where an electrode of a sputtering apparatus is 30.5 cm in diameter.

Further, an amorphous silicon film containing Ar can be formed by the following, as well: an amorphous silicon film is formed by a plasma CVD method, a thermal CVD method, or a sputtering method and the amorphous silicon film is irradiated with an Ar ion by an ion doping method or an ion implantation method using argon (Ar) as a source gas. The Ar concentration in the amorphous silicon film can be controlled by an acceleration voltage, a dosage, or the like of ions. For example, the acceleration voltage can be set to be greater than or equal to 10 kV and less than or equal to 50 kV and the dosage can be set to be greater than or equal to $1\times10^{12}$ ions/cm$^2$ and less than or equal to $1\times10^{17}$ ions/cm$^2$.

Figure 2B:
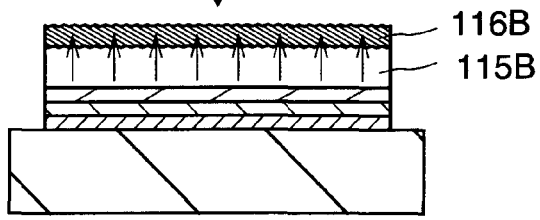

Next, heat treatment for gettering is performed. FIG. 2B is a drawing for describing the heat treatment step. A furnace can be used for the heat treatment, and it is preferable that the process temperature be equal to or higher than 450° C. and equal to or lower than 850° C. and the process time be equal to or longer than 1 hour and equal to or shorter than 4 hours. Further, heat atmosphere is preferably an inert atmosphere such as a nitrogen atmosphere or a rare gas atmosphere. The inert atmosphere means an atmosphere such that the surface of the gettering site layer 116A is not oxidized at the time of the heat treatment.

For this heat treatment, an RTA apparatus provided with a lamp light source for heating can be used. In the case of using the RTA apparatus, the lamp light source for heating is turned on once to 10 times for 1 second to 60 seconds, whereby the temperature of the semiconductor layer 115A is increased to be equal to or higher than 600° C. instantaneously. The heat temperature of the semiconductor layer 115A is preferably equal to or lower than 1000° C., and the preferable temperature range is from 650° C. to 750° C. both inclusive, considering the upper temperature limit of the base substrate 101.

By the heat treatment, a metal element contained in the semiconductor layer 115A is separated out into the gettering site layer 116A and captured by the gettering site layer 116A. As a result, the metal element concentration of the semiconductor layer 115A can be decreased. A layer denoted by reference symbol 115B in FIG. 2B corresponds to the semiconductor layer 115A after the metal element concentration is reduced by the gettering treatment. Further, a layer denoted by reference symbol 116B corresponds to the gettering site layer 116A after the gettering treatment. Note that, in the case where the gettering site layer 116A is formed of an amorphous semiconductor film such as an amorphous silicon film, the gettering site layer 116A is crystallized by this heat treatment for gettering, so that the crystallized gettering site layer 116B is formed. Furthermore, by this heat treatment for gettering, bonding force between the semiconductor layer 115B and the bonding layer 114 can be improved.

By the way, one of factors to cause metal contamination of the semiconductor layer of the SOI substrate is the ion irradiation step by an ion doping method at the time of forming the damaged region 113 shown in FIG. 1D in this embodiment mode. FIGS. 15 to 18 show results of analyzing metal contamination of a single-crystal silicon wafer which is irradiated with hydrogen ions by an ion doping method.

FIG. 15 shows measurement results by ICP-MS (inductively coupled plasma mass spectrometry). Analyzed by ICP-MS are Sample A doped with hydrogen ions by an ion doping method and Comparative Sample X doped with no hydrogen ion. Sample A was manufactured as follows: a silicon oxynitride film was formed in 600 nm thick over a top surface of a single-crystal silicon wafer by a plasma CVD method by using $SiH_4$ and $N_2O$ as a material; and the silicon wafer was irradiated with hydrogen ions through this silicon oxynitride film by an ion doping method. Hydrogen was used as a source gas of the hydrogen ions. In contrast, Comparative Sample X is a silicon wafer over which a silicon oxynitride film was formed in 600 nm thick under the same condition as that of Sample A, but not doped with hydrogen ions.

Figure 16:
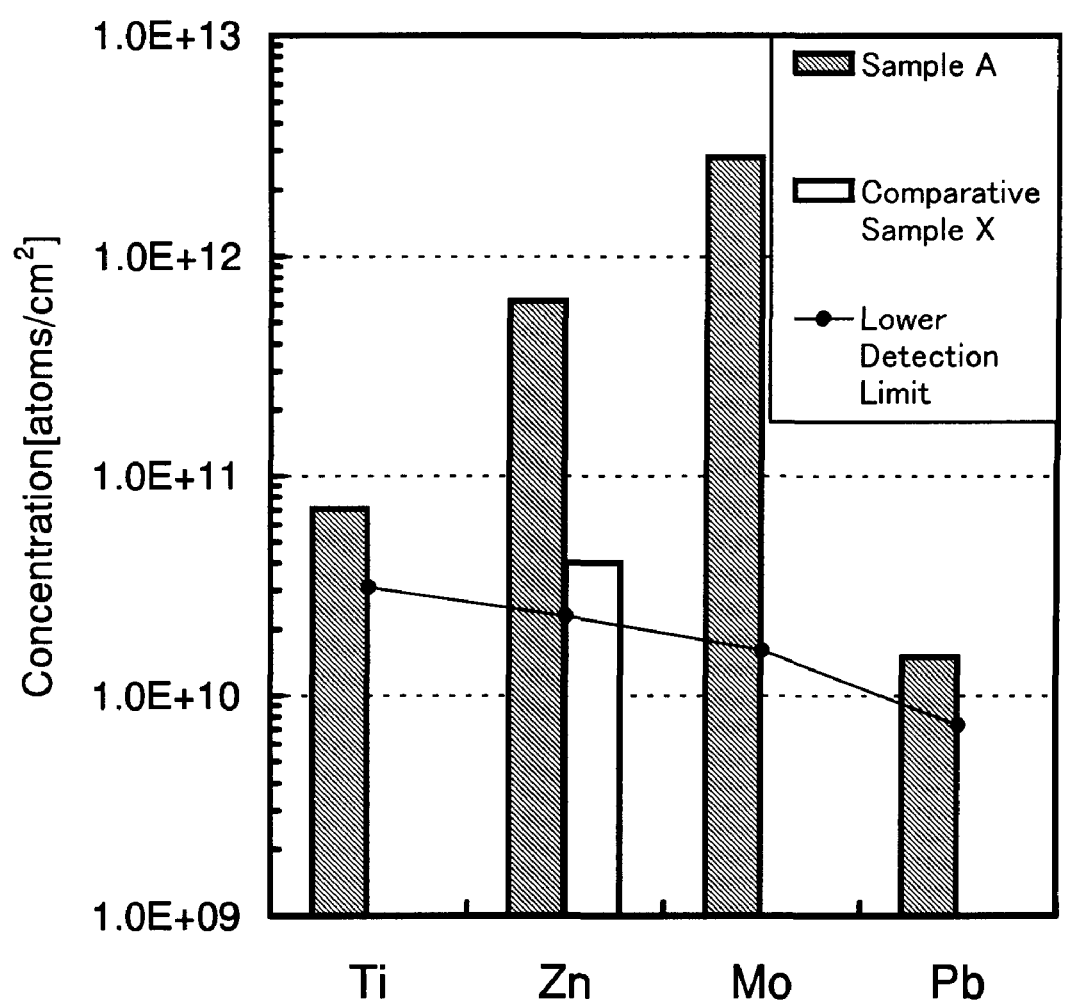
FIG. 16 is a graph showing results of analysis of FIG. 15.

FIG. 15 shows results of analyzing elements included in the silicon oxynitride films of Sample A and Comparative Sample X by ICP-MS. FIG. 15 shows metal elements of which concentrations are different by 10 times or more between Sample A and Comparative Sample X. FIG. 16 is a graph based on the data shown in the table of FIG. 15. The analysis results by ICP-MS indicate that ions of Ti, Zn, Mo, and Pb enter the silicon oxynitride films and the silicon wafers together with the hydrogen ions. For example, Mo is an electrode material of an ion doping apparatus.

Figure 17:
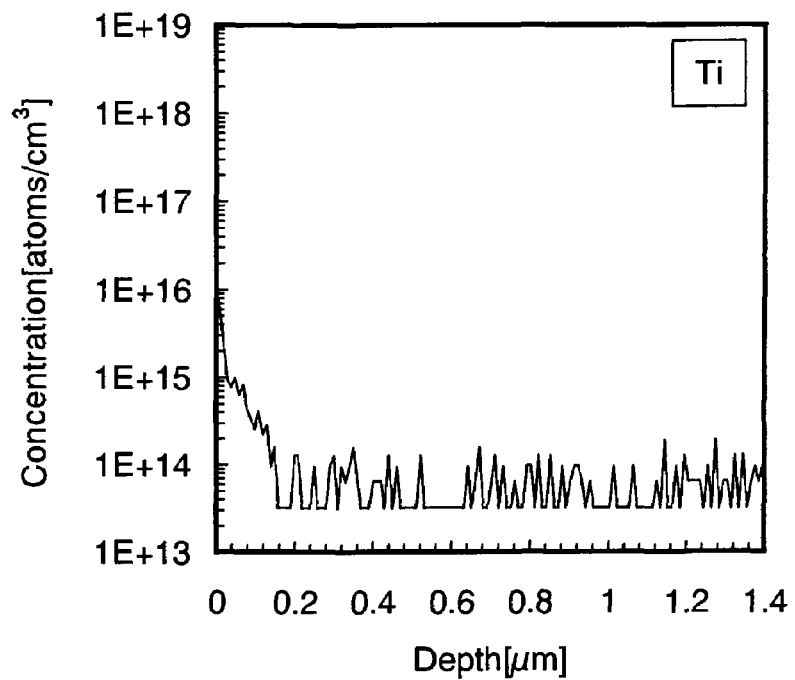
FIG. 17 is an in-depth profile of Ti in a silicon wafer, analyzed by SIMS.
Figure 18:
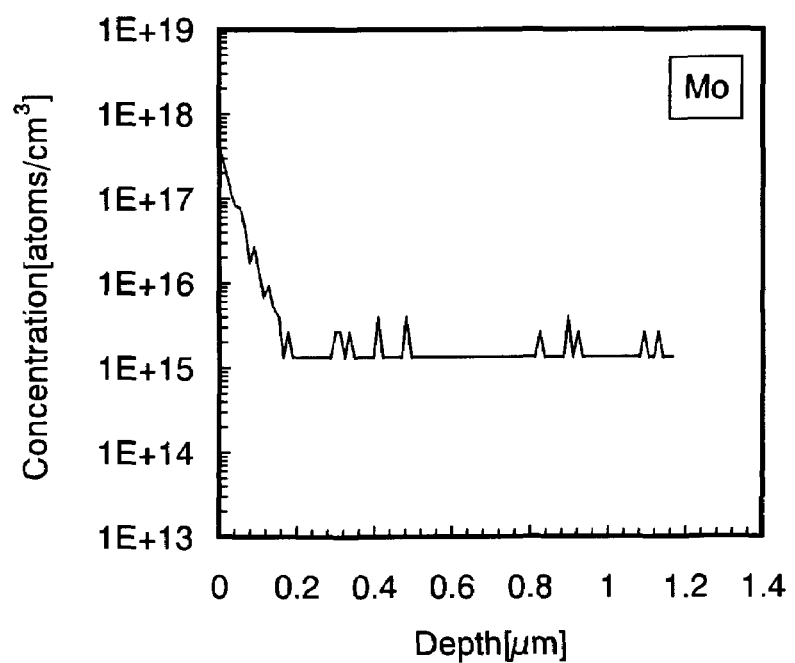
FIG. 18 is an in-depth profile of Mo in a silicon wafer, analyzed by SIMS.

Then, the in-depth distribution of a metal element in a silicon wafer doped with hydrogen ions by an ion doping method (this distribution is called a depth profile) was analyzed by SIMS. FIGS. 17 and 18 each show a depth profile of the metal element in the silicon wafer. FIG. 17 is a Ti profile, and FIG. 18 is a Mo profile. This sample is a single-crystal silicon wafer irradiated with hydrogen ions by an ion doping method, and a silicon oxynitride film is not formed over this wafer. From the depth profiles shown in FIGS. 17 and 18, it is understood that the metal elements enter the silicon wafer by doping with hydrogen ions without mass separation.

The analysis results of FIGS. 15 to 18 indicate that the metal contamination of the semiconductor layer of the SOI substrate becomes remarkable due to the ion irradiation by an ion doping method in forming the damaged region. According to the present invention, this metal contamination is solved. Therefore, ion irradiation by an ion doping method can be carried out positively when the damaged region 113 is formed. That is to say, according to this embodiment mode, tact time can be shortened and the effect of metal contamination can be suppressed by forming the damaged region 113 with an ion shower doping apparatus.

After the heat treatment for gettering, the gettering site layer 116B is removed. The removal of the gettering site layer 116B can be performed by etching. In the case where the gettering site layer 116B is removed by dry etching, a chlorine-based gas such as $Cl_2$, $BCl_3$, or $SiCl_4$, a fluorine-based gas such as $CF_4$, $NF_3$, or $SF_6$, or a bromine-based gas such as HBr can be used. In the case of wet etching, an alkaline solution such as a solution containing tetra methyl ammonium hydroxide $((CH_3)_4NOH$, which is called TMAH) can be used as an etchant.

Figure 2C:
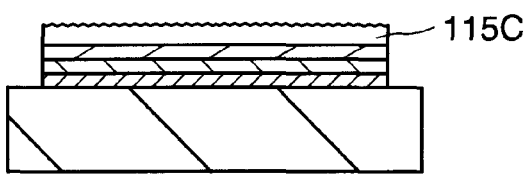

Since the gettering site layer 116B is formed of a semiconductor film, the damaged region 113 remaining on the semiconductor layer 115B can be removed by the etching treatment of the gettering site layer 116B by controlling process time of the etching. Further, by controlling the process time of the etching, an upper portion of the semiconductor layer 115B can be removed by this etching treatment, so that thinning treatment for thinning the semiconductor layer 115B to a desired thickness can be performed. FIG. 2C is a cross-sectional view for describing thinning of the semiconductor layer 115B at the step of removing the gettering site layer 116B. A layer denoted by reference symbol 115C is the semiconductor layer 115B after being thinned.

Further, instead of the etching, by polishing treatment such as CMP (chemical mechanical polishing), the removal of the gettering site layer 116B and the damaged region 113 can be performed, as well. Further, the removal of the gettering site layer 116B and the thinning of the semiconductor layer 115B can be performed by polishing treatment, as well. Further alternatively, by performing etching treatment and polishing treatment in this order, the removal of the gettering site layer 116B and the damaged region 113, or the removal of the gettering site layer 116B and the thinning of the semiconductor layer 115B can be performed.

Crystal defects are formed in the semiconductor layer 115C of the SOI substrate 131 by the ion irradiation step, the separation step, or the like; therefore, heat treatment for improving the crystallinity of the semiconductor layer 115C is preferably performed. This heat treatment can be performed by thermal treatment using a furnace at a temperature which is equal to or higher than 600° C., heat treatment using a lamp light source with an RTA apparatus, treatment by laser light irradiation, or the like. In the laser light irradiation treatment, process time is short and temperature rise of the base substrate 101 can be suppressed.

Figure 2D:
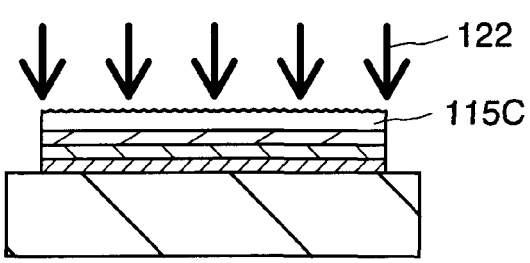

FIG. 2D is a cross-sectional view for describing the step of laser light irradiation treatment for recovering the crystallinity of the semiconductor layer 115C. As shown in FIG. 2D, irradiation of the semiconductor layer 115C with a laser light 122 is performed from the upper surface side of the semiconductor layer 115C.

The wavelength of the laser light 122 is a wavelength that is absorbed by the semiconductor layer 115C (the semiconductor substrate 111). The wavelength can be determined in consideration of the thickness and absorptance of the semiconductor layer 115C, the skin depth of the laser light, or the like. For example, the wavelength can be set in the range of 250 nm to 700 nm both inclusive. Further, the energy of the laser light 122 can be determined in consideration of the wavelength of the laser light 122, the skin depth of the laser light, the thickness of the semiconductor layer 115C, or the like. The energy of the laser light 122 can be set, for example, in the range of 300 mJ/cm$^2$ to 800 mJ/cm$^2$ both inclusive.

It is preferable that the semiconductor layer 115C be irradiated so as to be melt, by controlling the wavelength and energy of the laser light 122. By melting to recrystallize the semiconductor layer 115C by irradiation with the laser light 122, crystal defects can be reduced and the crystallinity can be recovered. Further, by melting the semiconductor layer 115C by irradiation with the laser light 122, planarity of the semiconductor layer 115C can be improved. Note that, in the thinning step of the semiconductor layer 115B shown in FIG. 2C, the thickness of the semiconductor layer 115C can be controlled to a thickness with which the laser light 122 is absorbed efficiently.

By the irradiation with the laser light 122, the planarity of the semiconductor layer 115C can be improved. Therefore, in the case where the step shown in FIG. 2C is performed by etching treatment without planalizing treatment, it is very effective that the recovery of crystallinity of the semiconductor layer 115C is performed by the laser light irradiation. After the irradiation with the laser light 122, polishing treatment such as CMP can also be performed on the surface of the semiconductor layer 115C.

As a laser for oscillating the laser light 122, a continuous wave laser, a pseudo continuous wave laser, or a pulsed laser can be used. As examples of a laser used in the step shown in FIG. 2D, there are an excimer laser such as a KrF laser, a gas laser such as an Ar laser or a Kr laser, and the like. In addition, a solid-state laser such as a YAG laser, a YVO$_4$ laser, a YLF laser, a YAlO$_3$ laser, a GdVO$_4$ laser, a KGW laser, a KYW laser, an alexandrite laser, a Ti:sapphire laser, a Y$_2$O$_3$ laser, and the like can be given. Note that the excimer laser is a pulsed laser, and some solid-state lasers such as a YAG laser can be used as any of a continuous laser, a pseudo continuous wave laser, and a pulsed laser.

The irradiation with the laser light 122 can be performed in an atmosphere containing oxygen such as an air atmosphere or an inert atmosphere such as a nitrogen atmosphere or a rare gas atmosphere. In order to perform the irradiation with the laser light 122 in an inert atmosphere, irradiation with the laser light 122 may be performed in an airtight chamber while the atmosphere in the chamber is controlled. In the case where the chamber is not used, by blowing an inert gas such as a nitrogen gas to the surface which is irradiated with the laser light 122, an nitrogen atmosphere can be formed. Note that the inert atmosphere is an atmosphere which prevents the surface of the semiconductor layer 115 from being oxidized at the time of the irradiation with the laser light 122.

As for the atmosphere for irradiating with the laser light 122, the inert atmosphere such as nitrogen or a rare gas is more effective in improving the planarity of the semiconductor layer 115C than the air atmosphere. In addition, since the inert atmosphere is more effective in suppressing generation of cracks and ridges than the air atmosphere, the applicable energy range for the laser light 122 is widened.

Figure 2E:
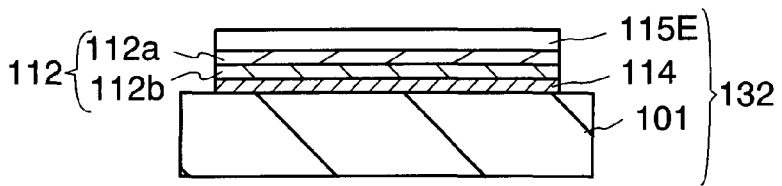

A cross-sectional view of an SOI substrate 132 formed through the above-described steps is FIG. 2E. A layer denoted by reference symbol 115E corresponds to the semiconductor layer 115C after the crystal defects are reduced. The SOI substrate 132 is a substrate in which the bonding layer 114, the insulating layer 112, and the semiconductor layer 115E are stacked over the base substrate 101. By bonding the bonding layer 114 and the base substrate 101 to each other, the semiconductor layer 115E is fixed to the base substrate 101.

Since the metal element concentration of the semiconductor layer is reduced according to the manufacturing method of an SOI substrate in this embodiment mode, a transistor in which off current is small and variation of the threshold voltage is suppressed can be manufactured by using the SOI substrate in this embodiment mode.

Embodiment Mode 2

A method for manufacturing an SOI substrate, which is different from the method described in Embodiment Mode 1 will be described in this embodiment mode. FIGS. 3A to 3E are cross-sectional views showing one example of a manufacturing method of an SOI substrate.

Figure 3A:
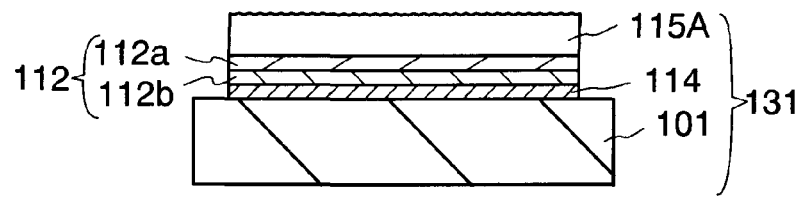
FIGS. 3A to 3E are cross-sectional views of a manufacturing method of an SOI substrate.

The SOI substrate 131 is formed by performing the steps described using FIGS. 1A to 1G. FIG. 3A is a cross-sectional view of the SOI substrate 131. The SOI substrate 131 is a substrate in which the bonding layer 114, the insulating layer 112, and the semiconductor layer 115A are stacked over the base substrate 101. In this embodiment mode, steps shown in FIGS. 3B to 3E are performed, so that a metal element of the semiconductor layer 115A is removed and the crystallinity of the semiconductor layer 115A is improved.

Figure 3B:
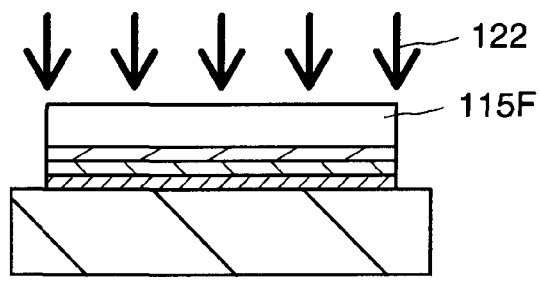

Since crystal defects are formed by the ion irradiation step or the like in the semiconductor layer 115A of the SOI substrate 131, heat treatment for improving the crystallinity of the semiconductor layer 115A is performed. This heat treatment can be performed by heat treatment using a furnace at a temperature which is equal to or higher than 600° C., heat treatment using a lamp light source with an RTA apparatus, treatment by laser light irradiation, or the like. In the laser light irradiation treatment, process time is short and temperature rise of the base substrate 101 can be suppressed. Further, as described in Embodiment Mode 1, by melting the semiconductor layer 115A by laser light irradiation, crystal defects of the semiconductor layer 115A can be reduced and the planarity of surface of the semiconductor layer 115A can be improved. FIG. 3B is a cross-sectional view describing a laser light irradiation step.

By irradiating the semiconductor layer 115A with the laser light 122, a semiconductor layer 115F in which the crystallinity is improved and the surface is planarized can be formed. This irradiation step with the laser light 122 can be performed in a similar manner to the laser light irradiation step of FIG. 2D.

Figure 3C:
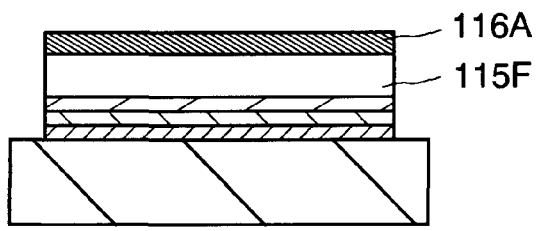

Next, a gettering site layer 116A is formed over the semiconductor layer 115F. FIG. 3C is a cross-sectional view for describing the formation step of the gettering site layer. The formation of the gettering site layer 116A can be performed in a similar manner to the formation method of the gettering site layer, described using FIG. 2A. It is preferable that the gettering site layer 116A be formed after a natural oxide film which is formed on the semiconductor layer 115F by irradiation with the laser light 122 is removed. The natural oxide film can be removed by etching the surface of the semiconductor layer 115F with an etchant containing hydrofluoric acid.

Figure 3D:
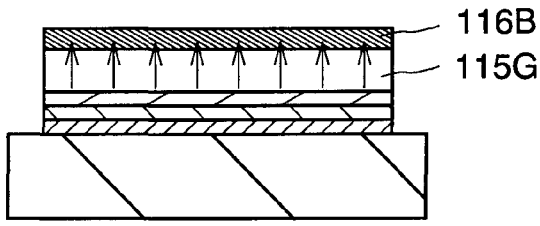

Next, heat treatment for gettering is performed. FIG. 3D is a drawing for describing the heat treatment step. This heat treatment can be performed with a furnace, and it is preferable that the process temperature be equal to or higher than 450° C. and equal to or lower than 850° C. and the process time be equal to or longer than 1 and equal to or shorter than 4 hours. Further, it is preferable that heat atmosphere be an inert atmosphere such as a nitrogen atmosphere.

For this heat treatment, an RTA apparatus provided with a lamp light source for heating can be used. In the case of using the RTA apparatus, the lamp light source for heating is turned on once to 10 times for 1 second to 60 seconds, whereby the temperature of the semiconductor layer 115F is increased to be equal to or higher than 600° C. instantaneously. The heat temperature of the semiconductor layer 115F is preferably equal to or lower than 1000° C., and the preferable temperature range is from 650° C. to 750° C. both inclusive, considering the upper temperature limit of the base substrate 101.

By the heat treatment, a metal element contained in the semiconductor layer 115F is separated out into the gettering site layer 116A and captured by the gettering site layer 116A. As a result, the metal element concentration of the semiconductor layer 115A can be decreased. A layer denoted by reference symbol 115G in FIG. 3D corresponds to the semiconductor layer 115F after the metal element concentration is reduced by the beat treatment for gettering. Further, the layer denoted by reference symbol 116B corresponds to the gettering site layer 116A after the gettering treatment. Note that, in the case where the gettering site layer 116A is formed of an amorphous semiconductor film such as an amorphous silicon film, the gettering site layer 116A is crystallized by this heat treatment for gettering, so that the crystallized gettering site layer 116B is formed. Furthermore, by this heat treatment, bonding force between the semiconductor layer 115F and the bonding layer 114 can be improved.

After the heat treatment for gettering, the gettering site layer 116B is removed. The removal of the gettering site layer 116B can be performed by etching. In the case where the gettering site layer 116B is removed by dry etching, a chlorine-based gas such as $Cl_2$, $BCl_3$, or $SiCl_4$, a fluorine-based gas such as $CF_4$, $NF_3$, or $SF_6$, or a bromine-based gas such as HBr can be used. In the case of wet etching, an alkaline solution such as a solution containing tetra methyl ammonium hydroxide $((CH_3)_4NOH$, which is called TMAH) can be used as an etchant.

Figure 3E:
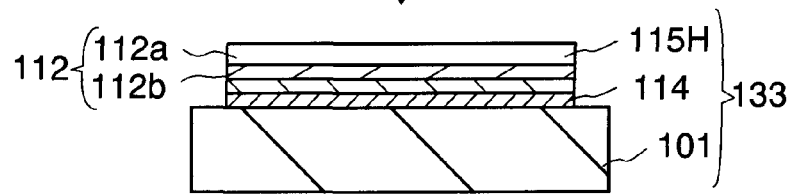

Since the gettering site layer 116B is formed of a semiconductor film, the damaged region 113 remaining on the semiconductor layer 115G can be removed by the etching treatment of the gettering site layer 116B by controlling process time of the etching. Further, by controlling the process time of the etching, an upper portion of the semiconductor layer 115G can be removed by this etching treatment, so that thinning treatment for thinning the semiconductor layer 115G to a desired thickness can be performed. FIG. 3E is a cross-sectional view for describing thinning of the semiconductor layer 115B at the step of removing the gettering site layer 116B. A layer denoted by reference symbol 115H is the semiconductor layer 115G after being thinned.

Further, instead of the etching, by polishing treatment such as CMP, the removal of the gettering site layer 116B and the damaged region 113 can be performed, as well. Further, the removal of the gettering site layer 116B and the thinning of the semiconductor layer 115G can be performed by polishing treatment, as well. Further alternatively, by performing etching treatment and polishing treatment in this order, the removal of the gettering site layer 116B and the damaged region 113, or the removal of the gettering site layer 116B and the thinning of the semiconductor layer 115G can be performed.

A cross-sectional view of an SOI substrate 133 formed through the above-described steps is FIG. 3E. The SOI substrate 133 is a substrate in which the bonding layer 114, the insulating layer 112, and a semiconductor layer 115H are stacked over the base substrate 101. By bonding the bonding layer 114 and the base substrate 101 to each other, the semiconductor layer 115H is fixed to the base substrate 101.

Since the metal element concentration of the semiconductor layer is reduced according to the manufacturing method of an SOI substrate in this embodiment mode, a transistor in which off current is small and variation of the threshold voltage is suppressed can be manufactured by using the SOI substrate in this embodiment mode.

Embodiment Mode 3

A method for manufacturing an SOI substrate, which is different from the method described in Embodiment Mode 1 will be described in this embodiment mode. FIGS. 4A to 4E are cross-sectional views showing one example of the manufacturing method of an SOI substrate in this embodiment mode.

First, the SOI substrate 131 is formed by performing the steps described using FIGS. 1A to 1G. The SOI substrate 131 is a substrate in which the bonding layer 114, the insulating layer 112, and the semiconductor layer 115A are stacked over the base substrate 101. Next, gettering of removing a metal element of the semiconductor layer 115A of the SOI substrate 131 is performed.

Figure 4A:
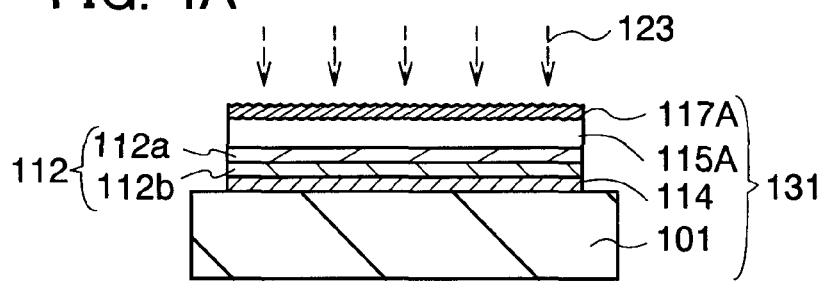
FIGS. 4A to 4E are cross-sectional views of a manufacturing method of an SOI substrate and show a process following FIG. 1G.

First, a gettering site region 117A is formed in an upper portion of the semiconductor layer 115A. FIG. 4A is a cross-sectional view for describing the step of forming the gettering site region 117A.

The gettering site region 117A is formed by irradiating the semiconductor layer 115A with an ion beam 123 containing an ion of a Group 18 element by an ion doping method or an ion implantation method. The gettering site region 117A includes one or more kinds of Group 18 elements selected from He, Ne, Ar, Kr, and Xe.

The Group 18 element concentration of the gettering site region 117A can be set to be equal to or more than $1 \times 10^{18}$ atoms/cm$^3$ and less than or equal to $1 \times 10^{22}$ atoms/cm$^3$, and it is more preferable that the Group 18 element concentration of the gettering site region 117A be equal to or more than $1 \times 10^{20}$ atoms/cm$^3$ and less than or equal to $5 \times 10^{21}$ atoms/cm$^3$. The Group 18 element concentration of the gettering site region can be analyzed by SIMS (secondary ion mass spectrometry). The Group 18 element is contained in the gettering site region 117A so that the peak concentration is greater than or equal to $1 \times 10^{18}$ atoms/cm$^3$ and less than or equal to $1 \times 10^{22}$ atoms/cm$^3$ in an in-depth profile of the Group 18 element analyzed by SIMS, and is preferably greater than or equal to $1 \times 10^{20}$ atoms/cm$^3$ and less than or equal to $5 \times 10^{21}$ atoms/cm$^3$.

The thickness of the gettering site region 117A can be controlled by the acceleration energy of the ion beam 123 and the injection angle of the ion beam 121. The acceleration energy can be controlled by an acceleration voltage, a dosage, or the like. In order to form the gettering site region 117A in an upper portion of the semiconductor layer 115A, the acceleration voltage is set to be low, for example, equal to or higher than 10 kV and equal to or lower than 50 kV. In this range of the acceleration voltage, when the semiconductor substrate 111 is a single-crystal silicon substrate and Ar is to be added, Ar can be added at a depth in the range of 40 nm to 150 nm both inclusive from the top surface of the semiconductor layer 115A by controlling the dosage in the range of $1 \times 10^{12}$ ions/cm$^2$ to $1 \times 10^{17}$ ions/cm$^2$ both inclusive. That is, the gettering site region 117A can be formed with a thickness of about 40 nm to 150 nm in an upper portion of the semiconductor layer 115A.

Figure 4B:
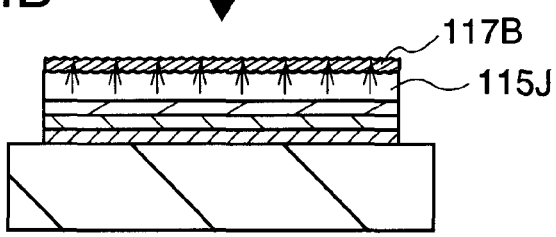

Next, heat treatment for gettering is performed. FIG. 4B is a drawing for describing the heat treatment step. This heat treatment can be performed in a similar manner to the heat treatment for gettering shown in FIG. 2B. For example, in the case of using a furnace, it is preferable that the process temperature be equal to or higher than 450° C. and equal to or lower than 850° C. and the process time be equal to or longer than 1 hour and equal to or shorter than 4 hours. Further, heat atmosphere is preferably an inert atmosphere such as a nitrogen atmosphere or a rare gas atmosphere. The inert atmosphere means an atmosphere such that the surface of the semiconductor layer 115A is not oxidized at the time of the heat treatment.

Further, in the case of using an RTA apparatus, a lamp light source for heating is turned on once to 10 times for 1 second to 60 seconds, whereby the temperature of the semiconductor layer 115A is increased to be equal to or higher than 600° C. instantaneously. The heat temperature of the semiconductor layer 115A is preferably equal to or lower than 1000° C., and the preferable temperature range is from 650° C. to 750° C. both inclusive, considering the upper temperature limit of the base substrate 101.

By the heat treatment, a metal element contained in the semiconductor layer 115A is separated out into the gettering site region 117A and captured by the gettering site region 117A. As a result, the metal element concentration of the semiconductor layer 115A can be decreased. A layer denoted by reference symbol 115J in FIG. 4B corresponds to the semiconductor layer 115A after the metal element concentration is reduced by the gettering treatment. Further, a layer denoted by reference symbol 117B corresponds to the gettering site region 117A after the gettering treatment. Note that, in the case where the gettering site region 117A is formed of an amorphous semiconductor film such as an amorphous silicon film, the gettering site region 117A is crystallized by this heat treatment for gettering, so that the crystallized gettering site region 117B is formed. Furthermore, by this heat treatment for gettering, bonding force between the semiconductor layer 115J and the bonding layer 114 can be improved.

As described in Embodiment Mode 1, the metal contamination of the semiconductor layer of the SOI substrate becomes remarkable due to the ion irradiation by an ion doping method in forming the damaged region (see FIGS. 15 to 18). According to this embodiment mode also, this metal contamination is solved. Therefore, ion irradiation by an ion doping method can be carried out positively when the damaged region 113 is formed. That is to say, according to this embodiment mode, tact time can be shortened and the effect of metal contamination can be suppressed by forming the damaged region 113 with an ion shower doping apparatus.

Figure 4C:
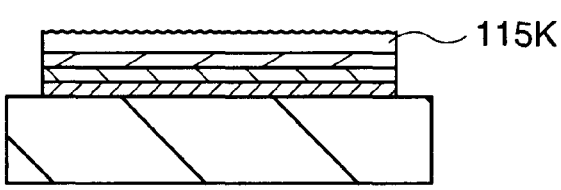

After the heat treatment for gettering, the gettering site region 117B is removed. FIG. 4C is a cross-sectional view for describing thinning of the semiconductor layer 115J at the step of removing the gettering site region 117B. A layer denoted by reference symbol 115K is the semiconductor layer 115J after the gettering site region 117B is removed. By removing the gettering site region 117B, the semiconductor layer 115K which is thinner than the semiconductor layer 115J (115A) separated from the semiconductor substrate 111 can be formed. That is, thinning of the semiconductor layer 115J can be performed by this step. Further, the damaged region 113 remaining on the semiconductor layer 115J can be removed, whereby the crystallinity of the semiconductor layer 115K can be improved. Accordingly, in a semiconductor device manufactured using an SOI substrate which is completed finally, interface state density between the semiconductor layer and a film formed thereon can be decreased.

The removal of the gettering site region 117B can be performed by etching. In the case where the gettering site region 117B is removed by dry etching, a chlorine-based gas such as $Cl_2$, $BCl_3$, or $SiCl_4$, a fluorine-based gas such as $CF_4$, $NF_3$, or $SF_6$, or a bromine-based gas such as HBr can be used. In the case of wet etching, an alkaline solution such as a solution containing tetra methyl ammonium hydroxide $((CH_3)_4NOH$, which is called TMAH) can be used as an etchant.

The semiconductor layer 115K can be etched by the etching gas or the etchant for etching the gettering site region 117B. Therefore, by controlling the etching time so that the gettering site region 117B is removed, and further, an upper portion of the semiconductor layer 115K is removed, thinning treatment for thinning the semiconductor layer 115J to a desired thickness can be performed.

Further, instead of the etching, by polishing treatment such as CMP, the removal of the gettering site region 117B can be performed, as well. Further, the thinning of the semiconductor layer 115K can be performed by polishing treatment, as well. Further alternatively, etching treatment and polishing treatment can be combined.

For example, the gettering site region 117B is removed by etching, and then, polishing treatment is performed on the semiconductor layer 115K, whereby removal of the remaining gettering site region 117B and flattening of surface of the semiconductor layer 115K can be performed. Alternatively, removal of the gettering site region 117B and thinning of the semiconductor layer 115K may be performed by etching treatment, and then, polishing treatment may be performed on the thinned semiconductor layer 115K.

Crystal defects are formed in the semiconductor layer 115A of the SOI substrate 131 by the ion irradiation step, the separation step, or the like; therefore, heat treatment for improving the crystallinity of the semiconductor layer 115K after being subjected to such a step is preferably performed. This heat treatment can be performed by thermal treatment using a furnace at a temperature which is equal to or higher than 600° C., heat treatment using a lamp light source with an RTA apparatus, treatment by laser light irradiation, or the like. In the laser light irradiation treatment, process time is short and temperature rise of the base substrate 101 can be suppressed.

Figure 4D:
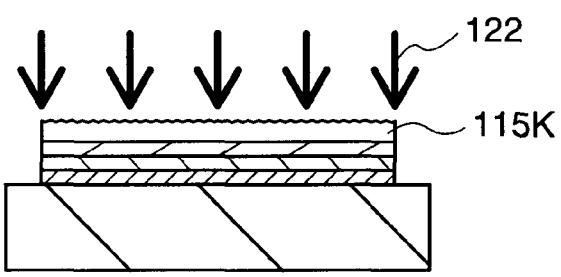

FIG. 4D is a cross-sectional view for describing the step of laser light irradiation treatment for recovering the crystallinity of the semiconductor layer 115K. As shown in FIG. 4D, irradiation of the semiconductor layer 115K with the laser light 122 is performed from the upper surface side of the semiconductor layer 115K. This irradiation treatment step with the laser light 122 can be performed in a similar manner to the irradiation step with the laser light 122 shown in FIG. 2D.

By the irradiation with the laser light, the surface planarity of the semiconductor layer 115K can be improved. Therefore, in the case where the step shown in FIG. 4C is performed by etching treatment without planalizing treatment, it is very effective that the recovery of crystallinity of the semiconductor layer 115K is performed by the laser light irradiation. After the irradiation with the laser light 122, polishing treatment such as CMP can also be performed on the surface of the semiconductor layer 115K.

Figure 4E:
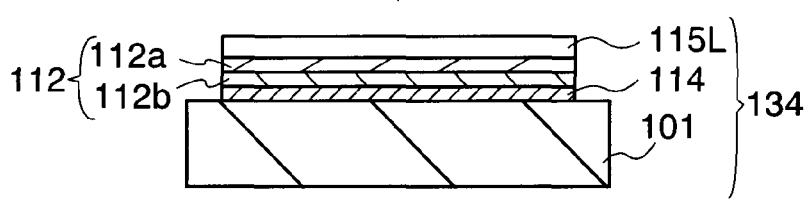

A cross-sectional view of an SOI substrate 134 formed through the above-described steps is FIG. 4E. A layer denoted by reference symbol 115L corresponds to the semiconductor layer 115K after the crystal defects are reduced. The SOI substrate 134 is a substrate in which the bonding layer 114, the insulating layer 112, and the semiconductor layer 115L are stacked over the base substrate 101. By bonding the bonding layer 114 and the base substrate 101 to each other, the semiconductor layer 115L is fixed to the base substrate 101.

Since the metal element concentration of the semiconductor layer is reduced according to the manufacturing method of an SOI substrate in this embodiment mode, a transistor in which off current is small and variation of the threshold voltage is suppressed can be manufactured by using the SOI substrate in this embodiment mode.

Embodiment Mode 4

A method for manufacturing an SOI substrate, which is different from the method described in Embodiment Mode 1 will be described in this embodiment mode. FIGS. 5A to 5E are cross-sectional views showing one example of a manufacturing method of an SOI substrate.

Figure 5A:
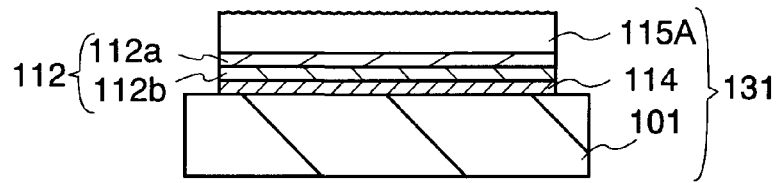
FIGS. 5A to 5E are cross-sectional views of a manufacturing method of an SOI substrate.

The SOI substrate 131 is formed by performing the steps described using FIGS. 1A to 1G. FIG. 5A is a cross-sectional view of the SOI substrate 131. The SOI substrate 131 is a substrate in which the bonding layer 114, the insulating layer 112, and the semiconductor layer 115A are stacked over the base substrate 101. In this embodiment mode, steps shown in FIGS. 5B to 5E are performed, so that a metal element of the semiconductor layer 115A is removed and the crystallinity of the semiconductor layer 115A is improved.

Figure 5B:
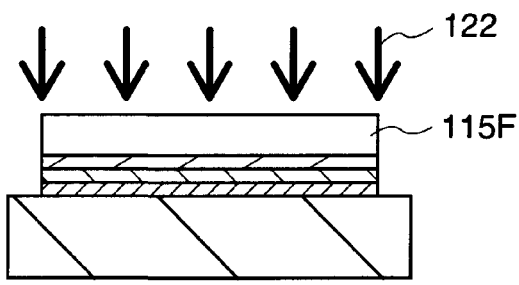

Next, similarly to Embodiment Mode 2, heat treatment for improving the crystallinity of the semiconductor layer 115A of the SOI substrate 131 is performed. This heat treatment is performed by laser light irradiation treatment in this embodiment mode. FIG. 5B is a cross-sectional view describing the laser light irradiation step. By irradiating the semiconductor layer 115A with the laser light 122, the semiconductor layer 115F in which the crystallinity is improved and the surface is planarized is formed. This irradiation step with the laser light 122 can be performed in a similar manner to the irradiation step with the laser light 122 of FIG. 2D.

Figure 5C:
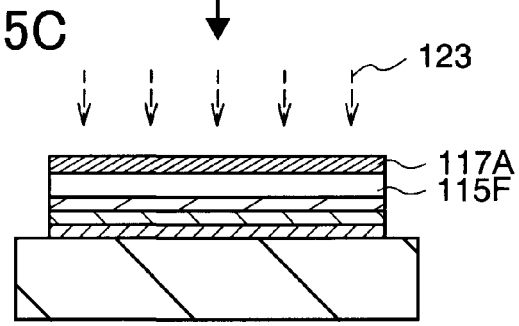

Next, the gettering site region 117A is formed in an upper portion of the semiconductor layer 115F. FIG. 5C is a cross-sectional view for describing the formation step of the gettering site region. The formation of the gettering site region 117A can be performed in a similar manner to the formation method of the gettering site region, described using FIG. 4A. By irradiating the semiconductor layer 115F with the ion beam 123 containing an ion of a Group 18 element by an ion doping method or an ion implantation method, the gettering site region 117A is formed in an upper portion of the semiconductor layer 115F.

Figure 5D:
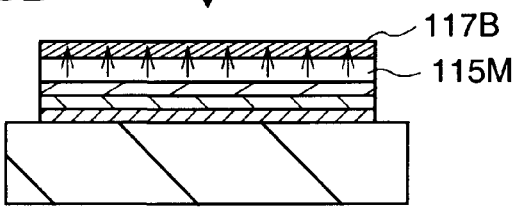

Next, heat treatment for gettering is performed. FIG. 5D is a drawing for describing the heat treatment step. This heat treatment can be performed in a similar manner to the heat treatment for gettering shown in FIG. 4B. For example, in the case of using a furnace, it is preferable that the process temperature be equal to or higher than 450° C. and equal to or lower than 850° C. and the process time be equal to or longer than 1 hour and equal to or shorter than 4 hours. Further, heat atmosphere is preferably an inert atmosphere such as a nitrogen atmosphere.

Further, in the case of using an RTA apparatus, a lamp light source for heating is turned on once to 10 times for 1 second to 60 seconds, whereby the temperature of the semiconductor layer 115F is increased to be equal to or higher than 600° C. instantaneously. The heat temperature of the semiconductor layer 115F is preferably equal to or lower than 1000° C., and the preferable temperature range is from 650° C. to 750° C. both inclusive, considering the upper temperature limit of the base substrate 101.

By the heat treatment, a metal element contained in the semiconductor layer 115F is separated out into the gettering site region 117A and captured by the gettering site region 117A. As a result, the metal element concentration of the semiconductor layer 115F can be decreased. A layer denoted by reference symbol 115M in FIG. 5D corresponds to the semiconductor layer 115F after the metal element concentration is reduced by the heat treatment for gettering. Further, the layer denoted by the reference symbol 117B corresponds to the gettering site region 117A after the gettering treatment.

Note that, in the case where the gettering site region 117A is formed of an amorphous semiconductor film such as an amorphous silicon film, the gettering site region 117A is crystallized by this heat treatment for gettering, so that the crystallized gettering site region 117B is formed. Furthermore, by this heat treatment, bonding force between the semiconductor layer 115M and the bonding layer 114 can be improved.

Figure 5E:
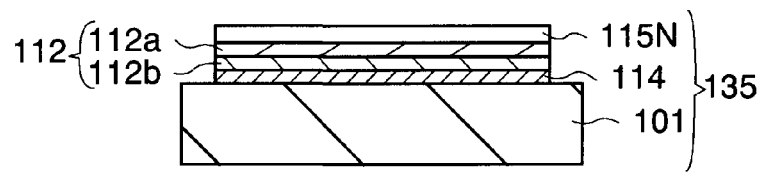

After the heat treatment for gettering, the gettering site region 117B is removed. FIG. 5E is a cross-sectional view of an SOI substrate 135 after the gettering site region 117B is removed. A layer denoted by reference symbol 115N in FIG. 5E is the semiconductor layer 115F after the gettering site region 117B is removed. By removing the gettering site region 117B, the semiconductor layer 115N which is thinner than the semiconductor layer 115F (115A) separated from the semiconductor substrate 111 can be formed. That is, thinning of the semiconductor layer 115F can be performed. Further, the damaged region 113 remaining on the semiconductor layer 115F can be removed by this step, whereby the crystallinity of the semiconductor layer 115N of the SOI substrate can be improved. Accordingly, in a semiconductor device manufactured using the SOI substrate 135, interface state density between the semiconductor layer 115N and a film formed thereon can be decreased.

The removal of the gettering site region 117B can be performed by etching. In the case where the gettering site region 117B is removed by dry etching, a chlorine-based gas such as $Cl_2$, $BCl_3$, or $SiCl_4$, a fluorine-based gas such as $CF_4$, $NF_3$, or $SF_6$, or a bromine-based gas such as HBr can be used. In the case of wet etching, an alkaline solution such as a solution containing tetra methyl ammonium hydroxide (($CH_3$)$_4$NOH, which is called TMAH) can be used as an etchant.

The semiconductor layer 115N can be etched by the etching gas or the etchant for etching the gettering site region 117B. Therefore, by controlling the etching time so that the gettering site region 117B is removed, and further, an upper portion of the semiconductor layer 115N is removed, thinning treatment for thinning the semiconductor layer 115N to a desired thickness can be performed. FIG. 5E is a cross-sectional view for describing the thinning of the semiconductor layer 115M at the step of removing the gettering site region 117B. The layer denoted by the reference symbol 115N is the semiconductor layer 115M after being thinned.

Further, instead of the etching, by polishing treatment such as CMP or the like, the removal of the gettering site region 117B can be performed, as well. Further, the thinning of the semiconductor layer 115N can be performed by polishing treatment, as well. Further alternatively, etching treatment and polishing treatment can be combined.

For example, the gettering site region 117B is removed by etching, and then, polishing treatment is performed on the semiconductor layer 115N, whereby removal of the gettering site region 117B and flattening of surface of the semiconductor layer 115N can be performed. Alternatively, removal of the gettering site region 117B and thinning of the semiconductor layer 115N may be performed by etching treatment, and then, polishing treatment may be performed on the thinned semiconductor layer 115N.

The cross-sectional view of the SOI substrate 135 formed through the above-described steps is FIG. 5E. The SOI substrate 135 is a substrate in which the bonding layer 114, the insulating layer 112, and the semiconductor layer 115N are stacked over the base substrate 101. By bonding the bonding layer 114 and the base substrate 101 to each other, the semiconductor layer 115N is fixed to the base substrate 101.

Since the metal element concentration of the semiconductor layer is reduced according to the manufacturing method of an SOI substrate in this embodiment mode, a transistor in which off current is small and variation of the threshold voltage is suppressed can be manufactured by using the SOI substrate in this embodiment mode.

Embodiment Mode 5

A method for manufacturing an SOI substrate, which is different from the method described in Embodiment Mode 1 will be described in this embodiment mode. FIGS. 6A to 6H are cross-sectional views showing one example of a manufacturing method of an SOI substrate.

Figure 6B:
FIGS. 6A to 6H are cross-sectional views of a manufacturing method of an SOI substrate.
Figure 6A:
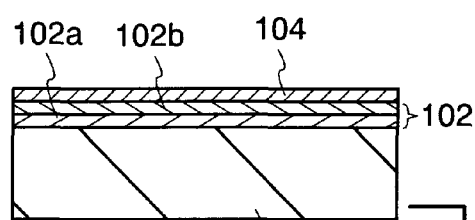

As shown in FIG. 6A, the base substrate 101 which is to be a base substrate of the SOI substrate is prepared. The base substrate 101 is cleaned, and an insulating layer 102 with a thickness which is greater than or equal to 10 nm and less than or equal to 400 nm is formed thereover.

The insulating layer 102 can have a single-layer structure or a multilayer structure of two or more layers. As the insulating layer 102, similarly to the insulating layer 112 shown in FIG. 1C, an insulating film containing silicon or germanium as its component such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, the following can also be used: an insulating film formed of a metal oxide such as aluminum oxide, tantalum oxide, or hafnium oxide; an insulating film formed of a metal nitride such as aluminum nitride; an insulating film formed of a metal oxynitride such as an aluminum oxynitride film; and/or an insulating film formed of a metal nitride oxide such as an aluminum nitride oxide film.

Further, in the case where a substrate containing an impurity which reduces reliability of a semiconductor device such as an alkali metal or an alkaline earth metal is used as the base substrate 101, at least one layer of a film which can prevent such an impurity from diffusing from the base substrate 101 into a semiconductor layer of an SOI substrate is preferably included in the insulating layer 102. Therefore, the insulating layer 102 is, similarly to the insulating layer 112, formed so as to include at least one layer of a silicon nitride film, a silicon nitride oxide film, an aluminum nitride film, an aluminum nitride oxide film, or the like.

The insulating layer 102 can be formed in a similar manner to the insulating layer 112; however, when the insulating layer 102 has a two-layer structure, the order of stacking layers is preferably opposite to that of the insulating layer 112. In other words, a film with a high blocking effect for preventing impurity diffusion, such as a silicon nitride film, a silicon nitride oxide film, an aluminum nitride film, or an aluminum nitride oxide film is formed as a lower-layer insulating film 102a, with a thickness which is greater than or equal to 5 nm and less than or equal to 200 nm. As an upper-layer insulating film 102b, a film with an effect of relieving internal stress of the insulating film 102a is formed.

For example, as a combination of the insulating film 102a and the insulating film 102b, the following combinations can be given: a silicon nitride film and a silicon oxide film, a silicon nitride film and a silicon oxynitride film, a silicon nitride oxide film and a silicon oxide film, a silicon nitride oxide film and a silicon oxynitride film, and the like. Note that, in each of these combinations, the former film corresponds to the insulating film 102a and the latter film corresponds to the insulating film 102b.

In this embodiment mode, the insulating layer 102 is formed so as to function as a blocking film. As the lower-layer insulating film 102a, a silicon nitride oxide film is formed by a plasma CVD method using $SiH_4$, $N_2O$, and $NH_3$ as a source gas. As the upper-layer insulating film 102b, a silicon oxynitride film is formed by a plasma CVD method using $SiH_4$ and $N_2O$ as a source gas.

After the formation of the insulating layer 102, a bonding layer 104 is formed over the insulating layer 102, as shown in FIG. 6A. This bonding layer 104 can be formed in a similar manner to the bonding layer 114 formed over the semiconductor substrate 111.

Figure 6C:
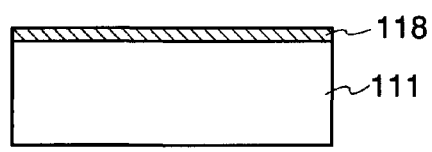

FIG. 6B is a cross-sectional view of the semiconductor substrate 111. After the semiconductor substrate 111 is cleaned, a protection film 118 is formed on the semiconductor substrate 111 as shown in FIG. 6C. The protection film 118 is formed with aims of preventing the semiconductor substrate 111 from being contaminated by impurities such as a metal in an ion irradiation step for forming a damaged region, preventing the semiconductor substrate 111 from being damaged due to shock of ions at the irradiation, and the like. This protection film 118 can be formed by depositing silicon oxide, silicon nitride, silicon nitride oxide, silicon oxynitride, or the like by a CVD method or the like. Alternatively, the protection film 118 can be formed by oxidizing or nitriding the semiconductor substrate 111.

Figure 6D:
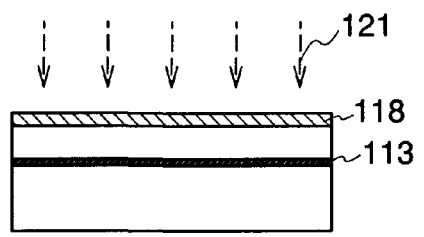

FIG. 6D is a cross-sectional view showing a step of forming the damaged region. Similarly to the step shown in FIG. 1D, the damaged region 113 is formed in the semiconductor substrate 111. After the formation of the damaged region 113, the protection film 118 is removed as shown in FIG. 6E. Note that, after the removal of the protection film 118, similarly to FIG. 1E, the bonding layer 114 can be formed as well. Further, the insulating layer 112 and the bonding layer 114 can be formed as well. Further alternatively, the bonding layer 114 can be formed over the protection film 118 with the protection film 118 left.

Figure 6F:
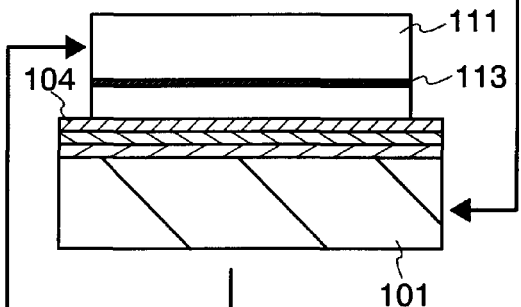
Figure 6E:

FIG. 6F is a cross-sectional view for describing a bonding step, which shows a state where the base substrate 101 and the semiconductor substrate 111 are attached to each other. This bonding step can be performed in a similar manner to the bonding step described using FIG. 1F. That is, by having the semiconductor substrate 111 and the bonding layer 104 in close contact with each other at room temperature, the semiconductor substrate 111 and the bonding layer 104 are bonded to each other so that the semiconductor substrate 111 and the base substrate 101 are attached to each other.

Figure 6G:
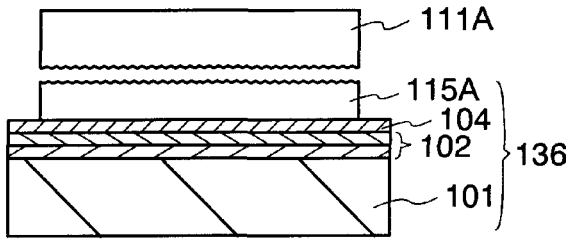

FIG. 6G is a view for describing a separation step of separating the semiconductor layer 115A from the semiconductor substrate 111. As shown in FIG. 6G, the semiconductor layer 115A is formed over the base substrate 101 by the separation step. The separation step in this embodiment mode can be performed in a similar manner to the separation step described using FIG. 1G. After the bonding between the semiconductor substrate 111 and the bonding layer 104, the semiconductor substrate 111 is heated at a temperature which is equal to or higher than 400° C. and equal to or lower than 700° C. Also in this embodiment mode, heat treatment at a temperature which is equal to or higher than 70° C. and equal to or lower than 300° C. is preferably performed before the heat treatment at the temperature which is equal to or higher than 400° C. so as to increase the bonding force between the semiconductor substrate 111 and the bonding layer 104 at their bonded interface.

Through the separation step shown in FIG. 6G, an SOI substrate 136 in which the semiconductor layer 115A is attached to the base substrate 101 is manufactured. The SOI substrate 136 has a multilayer structure in which the insulating layer 102, the bonding layer 104, and the semiconductor layer 115A are stacked in this order, and the bonding layer 104 and the semiconductor layer 115A are bonded to each other.

Figure 6H:
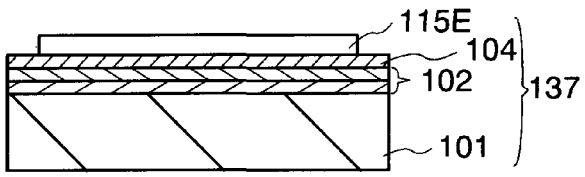

Next, the steps shown in FIGS. 2B to 2E are performed, so that the metal element concentration of the semiconductor layer 115A is reduced and improvement of the crystallinity and thinning of the semiconductor layer 115A are performed, whereby a SOI substrate 137 is formed. FIG. 6H is a cross-sectional view of the SOI substrate 137, in which the semiconductor layer 115E is attached to the base substrate 101.

Note that, the steps shown in FIGS. 3B to 3E may be performed on the SOI substrate 136 so that an SOI substrate in which the semiconductor layer 115H is attached to the base substrate 101 can be formed as well. Further, the steps shown in FIGS. 4A to 4E may be performed on the SOI substrate 136 so that an SOI substrate in which the semiconductor layer 115L is attached to the base substrate 101 can be formed as well. Further, the steps shown in FIGS. 5B to 5E may be performed on the SOI substrate 136 so that an SOI substrate in which the semiconductor layer 115N is attached to the base substrate 101 can be formed as well.

The metal element concentration of the semiconductor layer can be reduced in a manufacturing process of an SOI substrate according to the manufacturing method of an SOI substrate in this embodiment mode. Therefore, a transistor in which off current is small and variation of the threshold voltage is suppressed can be manufactured by using the SOI substrate in this embodiment mode.

Embodiment Mode 6

Various semiconductor devices can be manufactured by using the SOI substrate manufactured according to any manufacturing method of Embodiment Modes 1 to 5. In this embodiment mode, a method for manufacturing a semiconductor device will be described.

First, using FIGS. 7A to 7D and 8A to 8C, a method for manufacturing an n-channel thin film transistor and a p-channel thin film transistor will be described as a method for manufacturing a semiconductor device. By combining a plurality of thin film transistors (TFTs), various semiconductor devices can be formed.

Figure 7A:
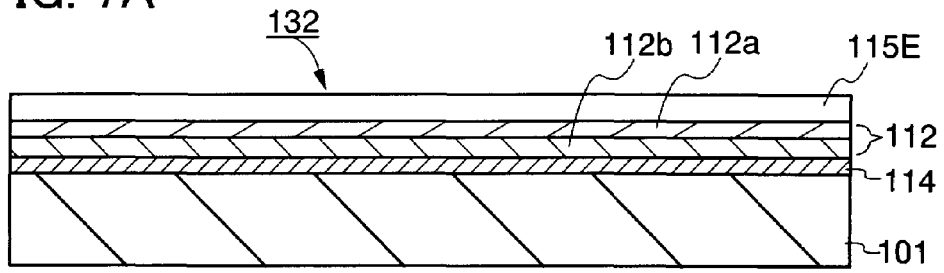
FIGS. 7A to 7D are cross-sectional views of a manufacturing method of a semiconductor device.

In this embodiment mode, the SOI substrate 133 manufactured by the method of Embodiment Mode 1 is used as an SOI substrate. FIG. 7A is a cross-sectional view of the SOI substrate 133 manufactured by the method described using FIGS. 1A to 1G and 2A to 2E.

Figure 7B:
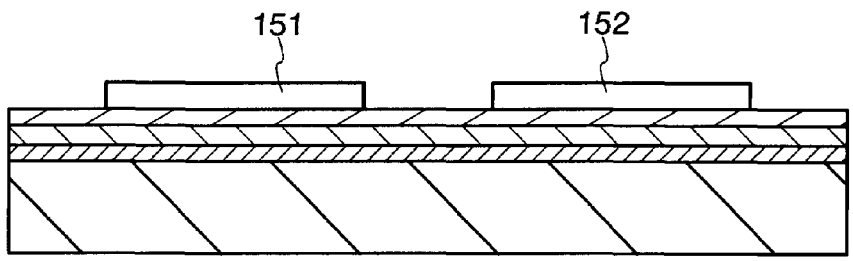

Next, the semiconductor layer 115E of the SOI substrate is isolated for each element by etching, so that semiconductor layers 151 and 152 are formed as shown in FIG. 7B. The semiconductor layer 151 is used for forming an n-channel TFT, and the semiconductor layer 152 is used for forming a p-channel TFT.

Figure 7C:
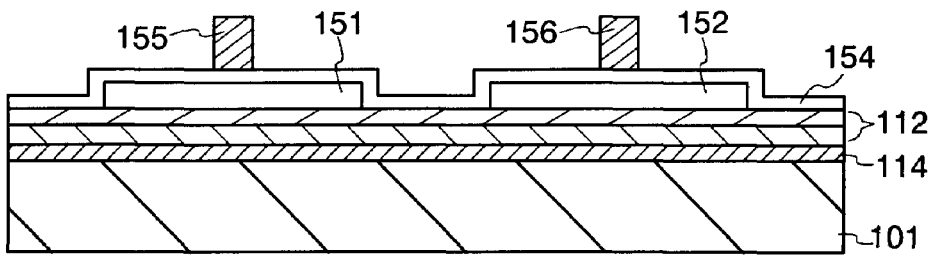

As shown in FIG. 7C, an insulating layer 154 is formed over the semiconductor layers 151 and 152. Next, gate electrodes 155 and 156 are formed over the semiconductor layers 151 and 152 respectively with the insulating layer 154 interposed therebetween.

Note that, before the etching of the semiconductor layer 115E, it is preferable to add an impurity element which is to be an acceptor such as boron, aluminum, or gallium, or an impurity element which is to be a donor such as phosphorous or arsenic into the semiconductor layer 115E in order to control the threshold voltages of the TFTs. For example, it is preferable that an acceptor be added into the region where the n-channel TFT is formed and a donor be added into the region where the p-channel TFT is formed.

Figure 7D:
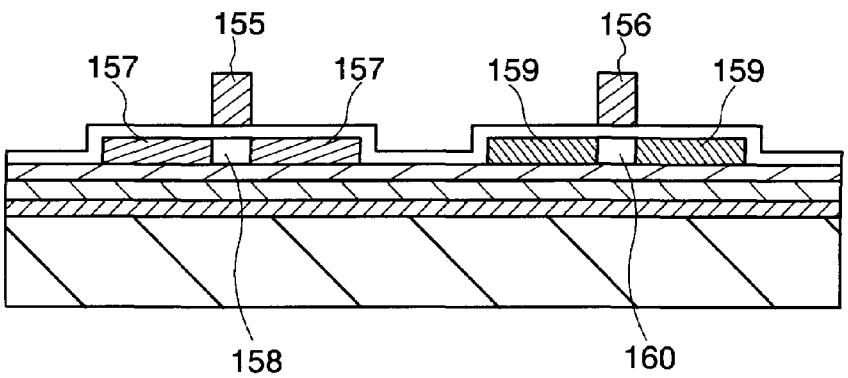

Next, as shown in FIG. 7D, n-type low-concentration impurity regions 157 and p-type high-concentration impurity regions 159 are formed in the semiconductor layers 151 and 152 respectively. First, the n-type low-concentration impurity regions 157 are formed in the semiconductor layer 151. For forming the n-type low-concentration impurity regions 157, the semiconductor layer 152 used for forming the p-channel TFT is covered with a resist and a donor is added into the semiconductor layer 151. As the donor, arsenic may be added. By adding the donor by an ion doping method or an ion implantation method, the gate electrode 155 functions as a mask and the n-type low-concentration impurity regions 157 are formed in the semiconductor layer 151 in a self-aligned manner. A region which overlaps with the gate electrode 155 in the semiconductor layer 151 becomes a channel formation region 158.

Next, the mask covering the semiconductor layer 152 is removed, and the semiconductor layer 151 used for forming the n-channel TFT is covered with a resist mask. Next, an acceptor is added into the semiconductor layer 152 by an ion doping method or an ion implantation method. As the acceptor, boron can be added. At the step of adding the acceptor, the gate electrode 156 functions as a mask and the p-type high-concentration impurity regions 159 are formed in the semiconductor layer 152 in a self-aligned manner. The high-concentration impurity regions 159 serve as a source region and a drain region. A region which overlaps with the gate electrode 156 in the semiconductor layer 152 becomes a channel formation region 160. Although the method in which the n-type low-concentration impurity regions 157 are formed, and then, the p-type high-concentration impurity regions 159 are formed is described in this embodiment mode, the p-type high-concentration impurity regions 159 may be formed first, as well.

Next, the resist covering the semiconductor layer 151 is removed, an insulating film with a single-layer structure or a stacked-layer structure is formed of a nitrogen compound such as silicon nitride and/or an oxide such as silicon oxide by a plasma CVD method or the like. This insulating film is anisotropically-etched in a perpendicular direction, so that side-wall insulating layers 161 and 162 which are in contact with the side-surfaces of the gate electrodes 155 and 156 respectively are formed. By this anisotropic etching, the insulating layer 154 is also etched.

Figure 8A:
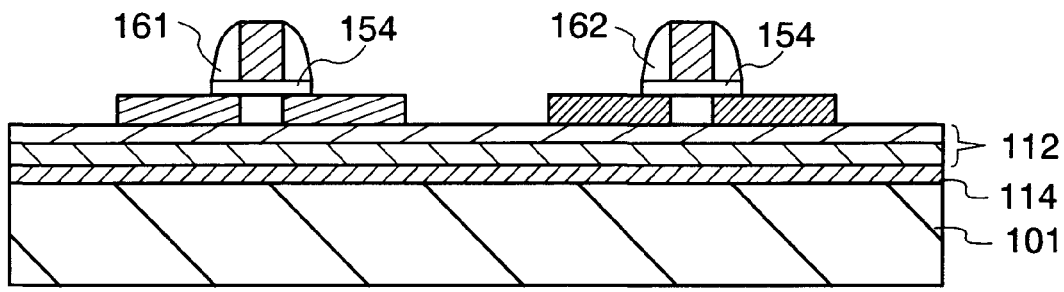
FIGS. 8A to 8C are cross-sectional views of a manufacturing method of a semiconductor device and show a process following FIG. 7D.
Figure 8B:
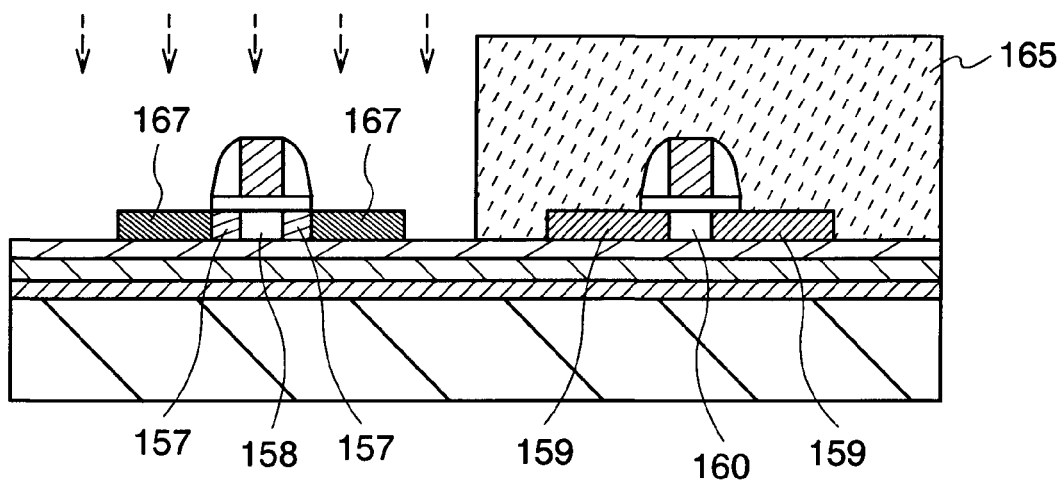

Next, as shown in FIG. 8B, the semiconductor layer 152 is covered with a resist 165. In order to form high-concentration impurity regions which serve as a source region and a drain region in the semiconductor layer 151, a high dosage of donors are added into the semiconductor layer 151 by an ion implantation method or an ion doping method. The gate electrode 155 and the side-wall insulating layer 161 function as a mask, and n-type high-concentration impurity regions 167 are formed. Next, heat treatment for activating the donors and the acceptors is performed.

Figure 8C:
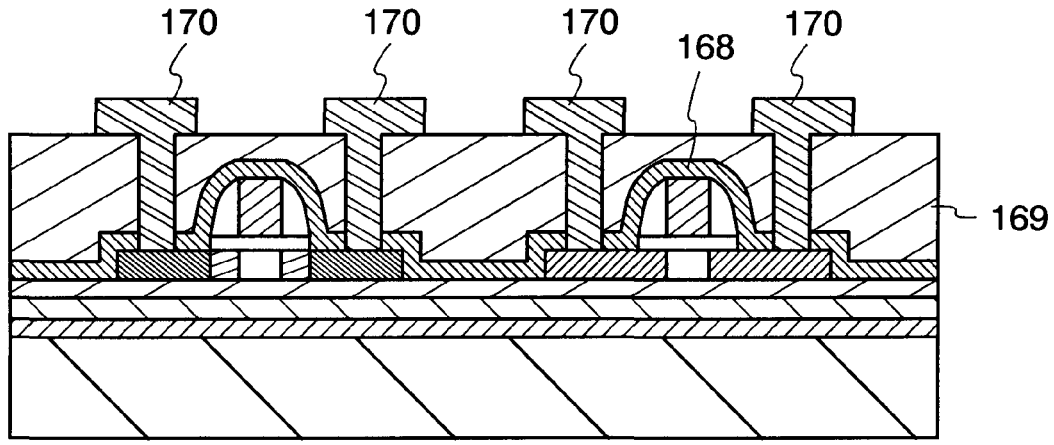

After the heat treatment for activation, as shown in FIG. 8C, an insulating layer 168 containing hydrogen is formed. After the formation of the insulating layer 168, heat treatment at a temperature equal to or higher than 350° C. and equal to or lower than 450° C. is performed thereon, so that the hydrogen contained in the insulating layer 168 is diffused into the semiconductor layers 151 and 152. The insulating layer 168 can be formed by depositing silicon nitride or silicon nitride oxide by a plasma CVD method at a process temperature of equal to or lower than 350° C. By supplying hydrogen to the semiconductor layers 151 and 152, defects to be trapping centers in the semiconductor layers 151 and 152 or at an interface with the insulating layer 154 can be efficiently compensated.

After that, an interlayer insulating layer 169 is formed. The interlayer insulating layer 169 can be formed of a film with a single-layer structure or a stacked-layer structure selected from an insulating film made of an inorganic material such as silicon oxide film or a BPSG (borophosphosilicate glass) and an organic resin film made of polyimide, acrylic, or the like. Contact holes are formed in the interlayer insulating layer 169, wirings 170 are formed as shown in FIG. 8C. The wirings 170 can be formed of a conductive film with a three-layer structure in which a low-resistance metal film such as an aluminum film or an aluminum alloy film is interposed between barrier metal films. Each barrier metal film can be formed of a metal film of molybdenum, chromium, titanium, or the like.

Through the above-described steps, a semiconductor device including the n-channel TFT and the p-channel TFT can be manufactured. Since the metal element concentration of the semiconductor layer in which the channel formation region is formed is reduced in the manufacturing process of the SOI substrate, a TFT in which off current is small and variation of the threshold voltage is suppressed can be manufactured.

Although the method of manufacturing a TFT is described using FIGS. 7A to 7D and 8A to 8C, a semiconductor device with high added value can be manufactured by forming a variety of semiconductor elements such as a capacitor and a resistor together with the TFT. Hereinafter, specific modes of semiconductor devices will be described using drawings.

Figure 9:
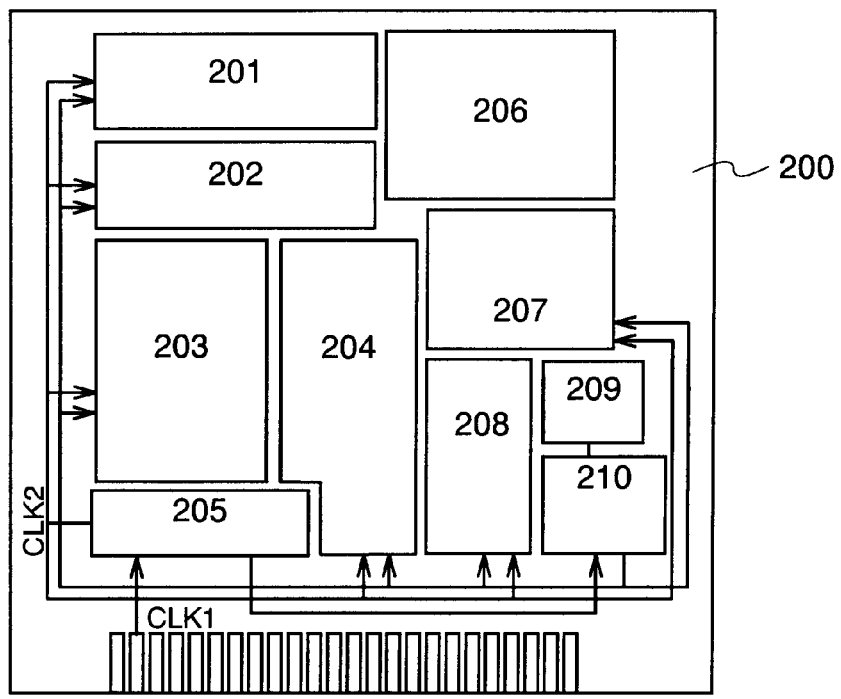
FIG. 9 is a block diagram of a structure of a microprocessor.

First, a microprocessor will be explained as an example of a semiconductor device. FIG. 9 is a block diagram showing an example of a structure of a microprocessor 200.

The microprocessor 200 includes an arithmetic logic unit (also called ALU) 201, an arithmetic logic unit controller (ALU controller) 202, an instruction decoder 203, an interrupt controller 204, a timing controller 205, a register 206, a register controller 207, a bus interface (Bus I/F) 208, a read only memory (ROM) 209, and a ROM interface 210.

An instruction input to the microprocessor 200 via the bus interface 208 is input to the instruction decoder 203 and decoded therein; then, the decoded instruction is input to the arithmetic logic unit controller 202, the interrupt controller 204, the register controller 207, and the timing controller 205. The arithmetic logic unit controller 202, the interrupt controller 204, the register controller 207, and the timing controller 205 perform various controls based on the decoded instruction.

The arithmetic logic unit controller 202 generates signals for controlling an operation of the arithmetic logic unit 201. While the microprocessor 200 executes a program, the interrupt controller 204 processes an interrupt request from an external input/output device or a peripheral circuit based on its priority or a mask state, and processes the interrupt request. The register controller 207 generates an address of the register 206, and reads/writes data from/to the register 206 in accordance with the state of the microprocessor 200. The timing controller 205 generates signals for controlling the timing of driving the arithmetic logic unit 201, the arithmetic logic unit controller 202, the instruction decoder 203, the interrupt controller 204, and the register controller 207. For example, the timing controller 205 is provided with an internal clock generator for generating an internal clock signal CLK2 based on a reference clock signal CLK1. As shown in FIG. 9, the internal clock signal CLK2 is input to another circuit.

Figure 10:
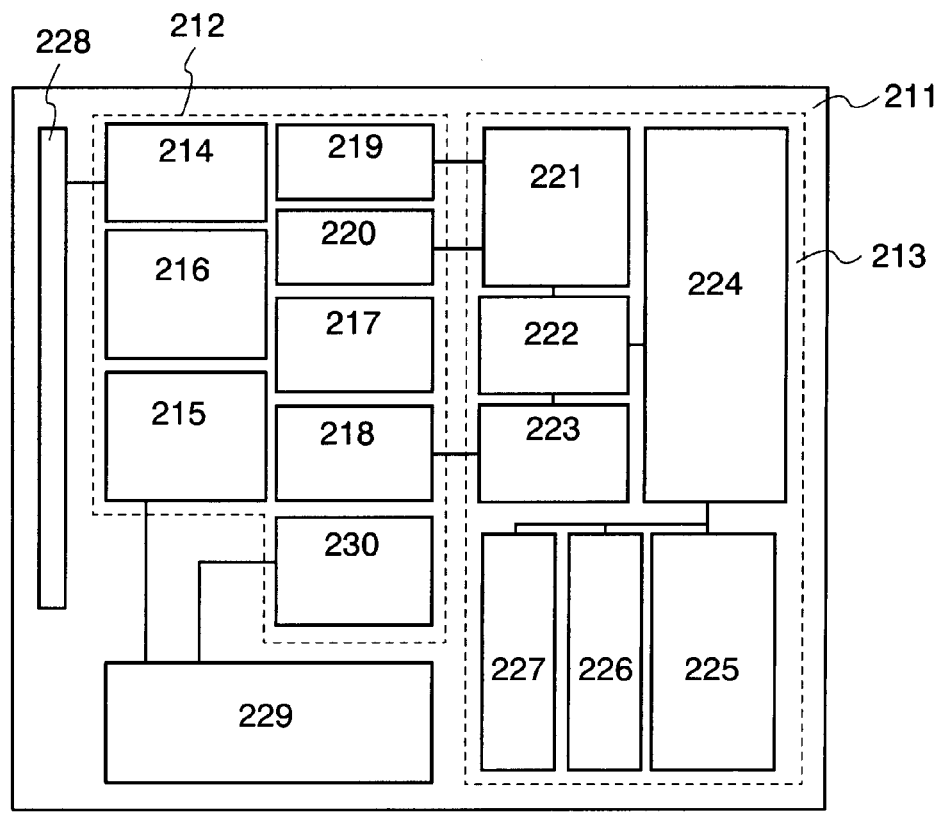
FIG. 10 is a block diagram of a structure of an RFCPU.

Next, an example of a semiconductor device having a function of communicating data wirelessly and also having an arithmetic function will be described. FIG. 10 is a block diagram showing an example of a structure of such a semiconductor device. The semiconductor device shown in FIG. 10 can be called a computer which operates by communicating signals with an external device by wireless communication (hereinafter the computer is referred to as an RFCPU).

An RFCPU 211 has an analog circuit portion 212 and a digital circuit portion 213 as shown in FIG. 10. The analog circuit portion 212 includes a resonant circuit 214 having a resonant capacitor, a rectifier circuit 215, a constant voltage circuit 216, a reset circuit 217, an oscillation circuit 218, a demodulation circuit 219, a modulation circuit 220, and a power supply control circuit 230. The digital circuit portion 213 includes an RF interface 221, a control register 222, a clock controller 223, a CPU interface 224, a central processing unit (CPU) 225, a random access memory (RAM) 226, and a read only memory (ROM) 227.

The operation of the RFCPU 211 will be briefly described below. A signal received by an antenna 228 causes induced electromotive force at the resonant circuit 214. The induced electromotive force is stored in a capacitor portion 229 via the rectifier circuit 215. The capacitor portion 229 preferably includes a capacitor such as a ceramic capacitor or an electric double layer capacitor. The capacitor portion 229 is not necessarily formed over the same substrate as the RFCPU 211 and may be incorporated into the RFCPU 211 as a component.

The reset circuit 217 generates a signal that resets the digital circuit portion 213 to be initialized. For example, the reset signal 217 generates, as a reset signal, a signal that rises with delay after increase in the power supply voltage. The oscillation circuit 218 changes the frequency and the duty ratio of a clock signal in accordance with a control signal generated by the constant voltage circuit 216. The demodulation circuit 219 is a circuit which demodulates received signals and the modulation circuit 220 is a circuit which modulates data for transmission.

For example, the demodulation circuit 219 includes a low pass filter, and binarizes received signals of an amplitude shift keying (ASK) system based on changes in amplitude of the signals. The modulation circuit 220 changes the amplitude of transmission signals of an amplitude shift keying (ASK) system to be transmitted; therefore, the modulation circuit 220 changes the resonance point of the resonant circuit 214, thereby changing the amplitude of communication signals.

The clock controller 223 generates a control signal for changing the frequency and the duty ratio of the clock signal in accordance with the power supply voltage or current consumption in the central processing unit 225. The power supply voltage is monitored by the power supply control circuit 230.

A signal that is input to the RFCPU 211 from the antenna 228 is demodulated by the demodulation circuit 219, and then divided into a control command, data, and the like by the RF interface 221. The control command is stored in the control register 222. The control command includes, reading of data stored in the read only memory 227, writing of data into the random access memory 226, an arithmetic instruction to the central processing unit 225, and the like.

The central processing unit 225 accesses the read only memory 227, the random access memory 226, and the control register 222 via the CPU interface 224. The CPU interface 224 has a function of generating an access signal for any one of the read only memory 227, the random access memory 226, or the control register 222 based on an address requested by the central processing unit 225.

As an arithmetic method of the central processing unit 225, a method may be employed in which the read only memory 227 stores an OS (operating system) and a program is read out and executed at the same time as start-up. Alternatively, a method may be employed in which a circuit dedicated to arithmetic is formed and an arithmetic process is conducted using hardware. Further alternatively, a method in which both hardware and software are used can be employed as the arithmetic method. In this method, a part of an arithmetic process is conducted in a circuit dedicated to arithmetic and the rest of the arithmetic process is conducted by the central processing unit 225 by using a program.

Next, a display device will be described using FIGS. 11, 12A and 12B, and 13A and 13B, as a semiconductor device.

In each manufacturing process of an SOI substrate described using FIGS. 1A to 1G, 2A to 2E, 3A to 3E, 4A to 4E, 5A to 5E, and 6A to 6H, any glass substrate such as a non-alkali glass substrate can be applied to the base substrate 101. Therefore, by using a glass substrate as the base substrate 101 and attaching a plurality of semiconductor layers thereto, a large-area SOI substrate with each side over one meter can be manufactured.

Figure 11:
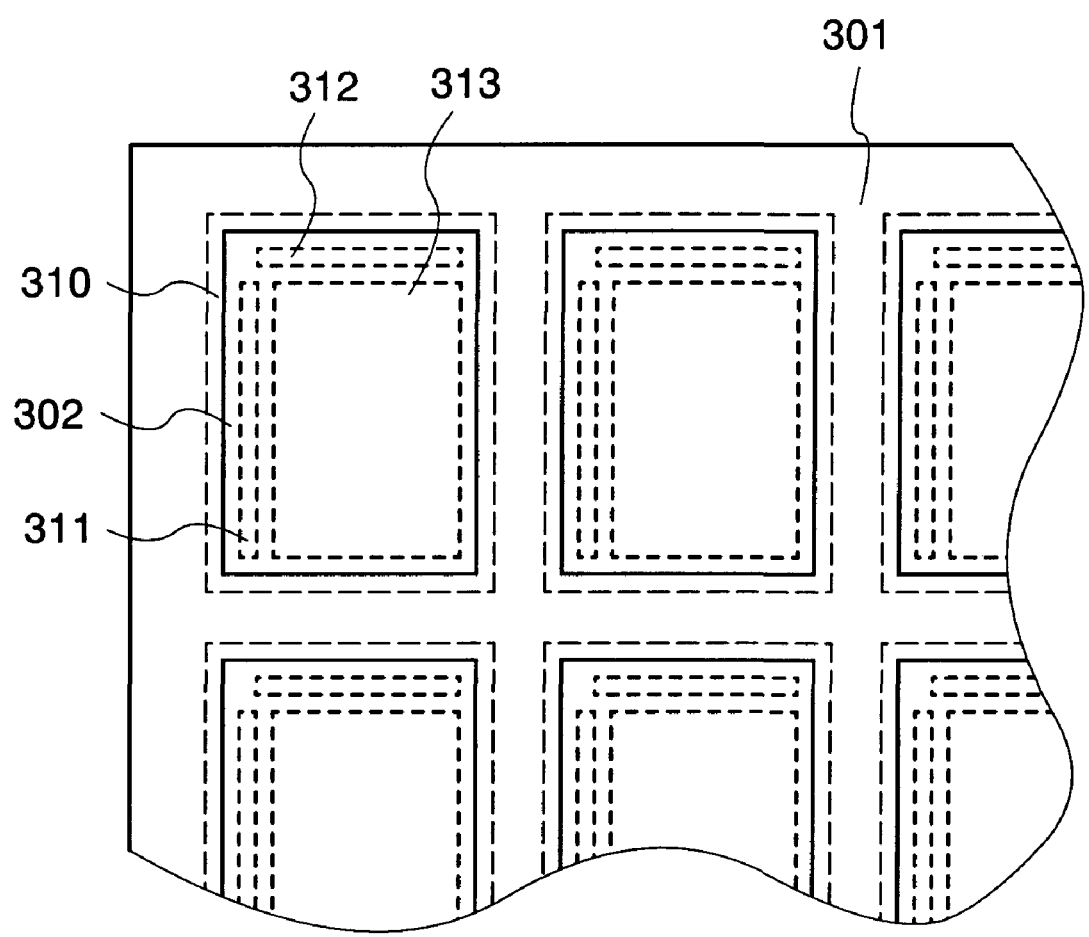
FIG. 11 is a plan view of an SOI substrate using a mother glass as a base substrate.

A large-area glass substrate called a mother glass, which is used to manufacture a display panel, can be used as a base substrate of an SOI substrate. FIG. 11 is a front view of an SOI substrate which uses a mother glass as the base substrate 101. With a plurality of semiconductor elements formed using such a large-area SOI substrate, a liquid crystal display device or an electroluminescent display device can be manufactured. In addition to such a display device, a variety of semiconductor devices such as solar cells, photo ICs, and semiconductor memory devices can be manufactured by using SOI substrates.

As shown in FIG. 11, a plurality of semiconductor layers 302 separated from a plurality of semiconductor substrates are attached to a mother glass 301. In order to cut out a plurality of display panels from the mother glass 301, the semiconductor layers 302 are preferably bonded within regions 310 where the display panels are formed (hereinafter each region is referred to as a display panel formation region 310). The display panel includes a scanning line driver circuit, a signal line driver circuit, and a pixel portion. Therefore, the display panel formation region 310 includes the region where these are formed (a scanning line driver circuit formation region 311, a signal line driver circuit formation region 312, and a pixel formation region 313) in the display panel formation region 310.

Figure 12A:
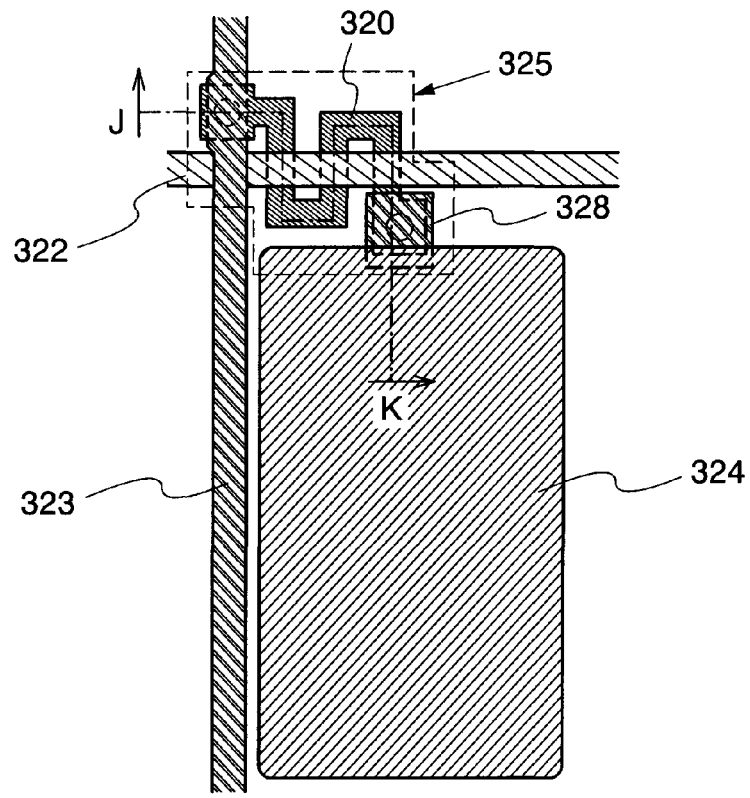
FIG. 12A is a plan view of a pixel of a liquid crystal display device and FIG. 12B is a cross-sectional view along a cutting line J-K in FIG. 12A.
Figure 12B:
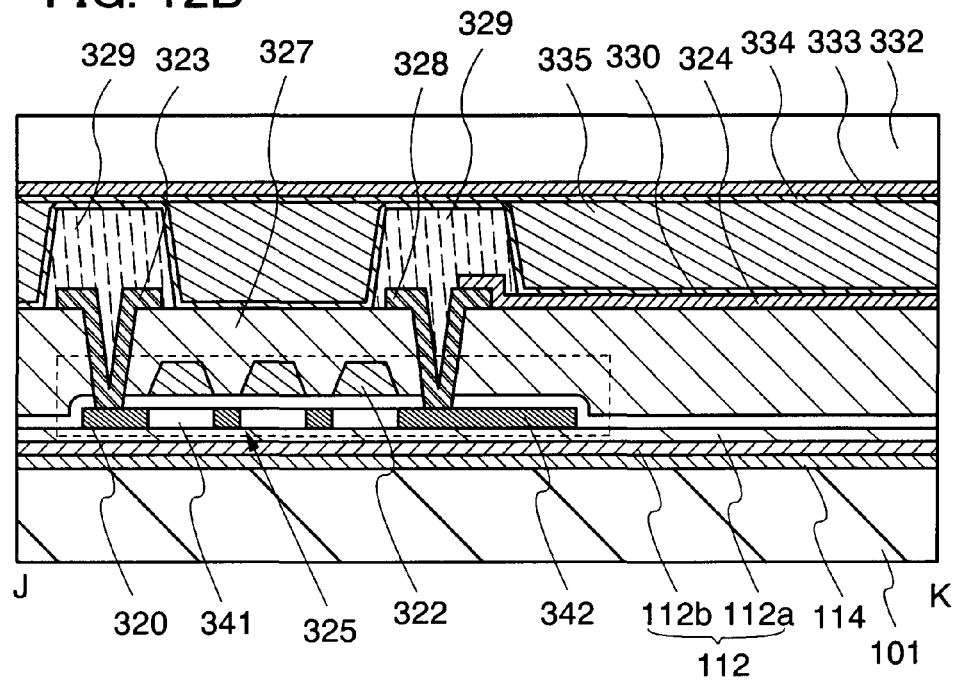

FIGS. 12A and 12B are drawings for describing a liquid crystal display device. FIG. 12A is a plan view of a pixel of the liquid crystal display device and FIG. 12B is a cross-sectional view along a cutting line J-K of FIG. 12A.

As shown in FIG. 12A, the pixel includes a semiconductor layer 320, a scanning line 322 intersecting with the semiconductor layer 320, a signal line 323 intersecting with the scanning line 322, a pixel electrode 324, and an electrode 328 which electrically connects the pixel electrode 324 with the semiconductor layer 320. The semiconductor layer 320 is a layer formed of the semiconductor layer 302 attached to the SOI substrate and included in a TFT 325 of the pixel.

As an SOI substrate, the SOI substrate 132 manufactured by the method of Embodiment Mode 1 is used. As shown in FIG. 12B, the insulating layer 112 and the bonding layer 114 are stacked over the base substrate 101. The semiconductor layer 320 of the TFT 325 is provided over the bonding layer 114. The base substrate 101 is the mother glass 301 which has been divided. The semiconductor layer 320 of the TFT 325 is a layer formed by etching the semiconductor layer of the SOI substrate so that the layer is isolated for each element. In this embodiment mode, channel formation regions 341 and n-type high-concentration impurity regions 342 which have been added with donors are formed in the semiconductor layer 320. A gate electrode of the TFT 325 is included in the scanning line 322 and one of a source electrode and a drain electrode of the TFT 325 is included in the signal line 323.

The signal line 323, the pixel electrode 324, and the electrode 328 are provided over the interlayer insulating film 327. Further, column spacers 329 are formed over the interlayer insulating film 327, and an orientation film 330 is formed covering the signal line 323, the pixel electrode 324, the electrode 328, and the column spacer 329. A counter substrate 332 is provided with a counter electrode 333 and an orientation film 334 that covers the counter electrode 333. The column spacers 329 are formed in order to keep space between the base substrate 101 and the counter substrate 332. A liquid crystal layer 335 is formed in the space formed by the column spacers 329. The interlayer insulating film 327 has a step at the connection portion between the n-type high-concentration impurity regions 342, and the signal line 323 and the electrode 328 due to the formation of contact holes; therefore, orientation of liquid crystals in the liquid crystal layer 335 is easily disordered at this connection portion. Therefore, the column spacers 329 are formed at the step portions to prevent the disorder of the orientation of liquid crystals.

Figure 13A:
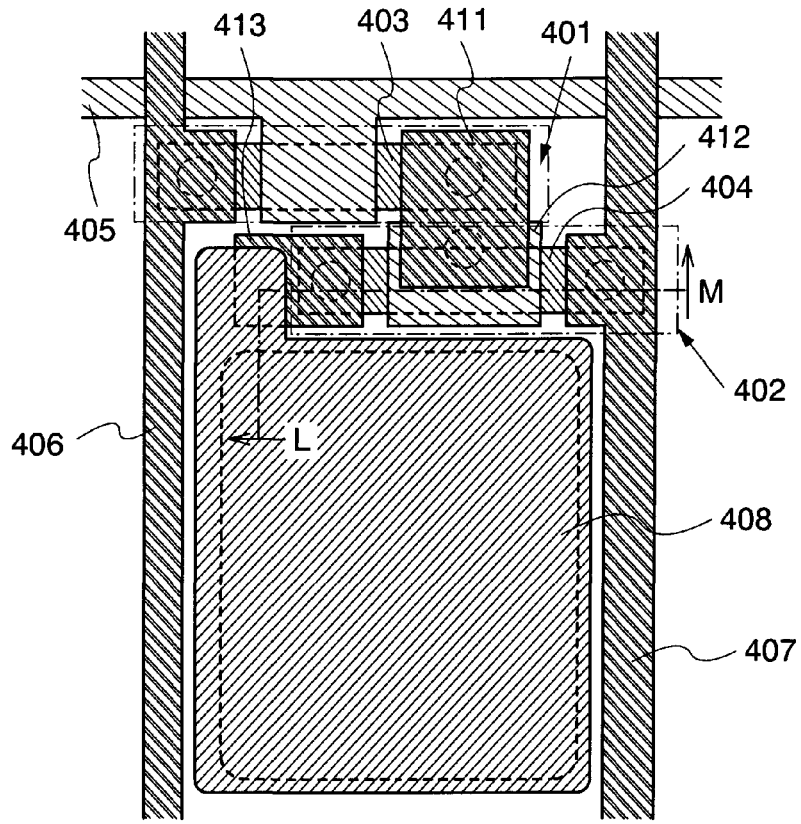
FIG. 13A is a plan view of a pixel of an electroluminescence display device and FIG. 13B is a cross-sectional view along a cutting line L-M in FIG. 13A.
Figure 13B:
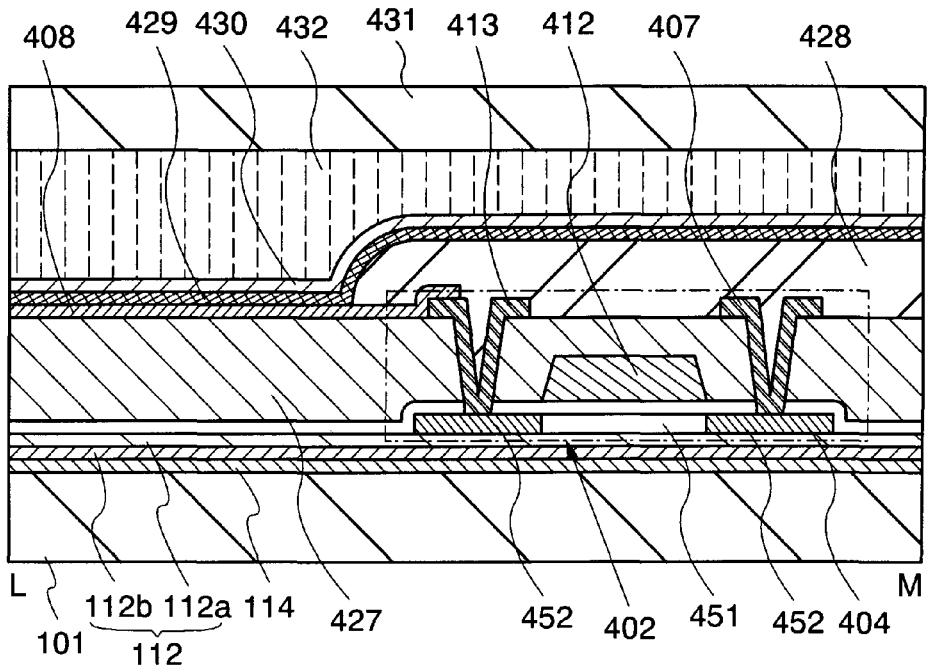

Next, an electroluminescent display device (hereinafter referred to as an EL display device) will be described. FIGS. 13A and 13B are drawings for describing an EL display device. FIG. 13A is a plan view of a pixel of the EL display device, and FIG. 13B is a cross-sectional view taken along a cutting line L-M of FIG. 13A.

As shown in FIG. 13A, the pixel includes a selection transistor 401 and a display control transistor 402 each including a TFT, a scanning line 405, a signal line 406, a current supply line 407, and a pixel electrode 408. Each pixel is provided with a light-emitting element having a structure in which a layer including an electroluminescent material (hereinafter this layer is referred to as an EL layer) is sandwiched between a pair of electrodes. One electrode of the light-emitting element is the pixel electrode 408. Further, a semiconductor layer 403 forms a channel formation region, a source region, and a drain region of the selection transistor 401. Further, a semiconductor layer 404 forms a channel formation region, a source region, and a drain region of the display control transistor 402. The semiconductor layers 403 and 404 are layers formed of the semiconductor layer 302 attached to the SOI substrate.

A gate electrode of the selection transistor 401 is included in the scanning line 405. One of a source electrode and a drain electrode of the selection transistor 401 is included in the signal line 406 while the other is formed as an electrode 411. A gate electrode 412 of the display control transistor 402 is electrically connected to the electrode 411. One of a source electrode and a drain electrode of the display control transistor 402 is formed as an electrode 413 which is electrically connected to the pixel electrode 408 while the other is included in the current supply line 407.

The display control transistor 402 is a p-channel TFT. As shown in FIG. 13B, a channel formation region 451 and p-type high-concentration impurity regions 452 are formed in the semiconductor layer 404. Note that, since the SOI substrate 132 manufactured by the method of Embodiment Mode 1 is used as an SOI substrate, the bonding layer 114 and the insulating layer 112 are stacked over the base substrate 101 as shown in FIG. 13B. Over the insulating layer 112, the semiconductor layer 404 of the display control transistor 402 and the semiconductor layer 403 of the selection transistor 401 exist.

An interlayer insulating film 427 is formed covering the gate electrode 412 of the display control transistor 402. The signal line 406, the current supply line 407, and the electrodes 411 and 413 are formed over the interlayer insulating film 427. Further, the pixel electrode 408 which is electrically connected to the electrode 413 is formed over the interlayer insulating film 427. The pixel electrode 408 is surrounded by an insulating partition wall layer 428 at the periphery. An EL layer 429 is formed over the pixel electrode 408, and a counter electrode 430 is formed over the EL layer 429. A counter substrate 431 is provided as a reinforcing plate, and is fixed to the base substrate 101 by a resin layer 432.

The grayscale of the EL display device is controlled by either a current drive method by which the luminance of the light-emitting element is controlled by the amount of current or a voltage drive method by which control is performed basically by the amount of voltage. The current drive method is difficult to adapt when transistors have characteristics which are largely different for each pixel, and therefore a compensation circuit for compensating variation in characteristics is necessary. When the EL display device is manufactured by using an SOI substrate through the manufacturing process of an SOI substrate and the gettering step, the selection transistor 401 and the display control transistor 402 do not have variation in electrical characteristics for each pixel; therefore, the current drive method can be employed in controlling the grayscale of the EL display device.

That is, various electronic devices can be manufactured by using the SOI substrate of the present invention. The electronic devices include cameras such as a video camera and a digital camera, a navigation system, a sound reproduction system (such as a car audio system and an audio component), a computer, a game machine, a mobile information terminal (such as a mobile computer, a cellular phone, a mobile game machine, and an electronic book reader), an image reproduction device provided with a recording medium, and the like. Note that the image reproduction device is provided with a display device for displaying images, and has a function of reproducing audio data and image data stored in a storage medium such as a DVD (digital versatile disc).

Figure 14A:
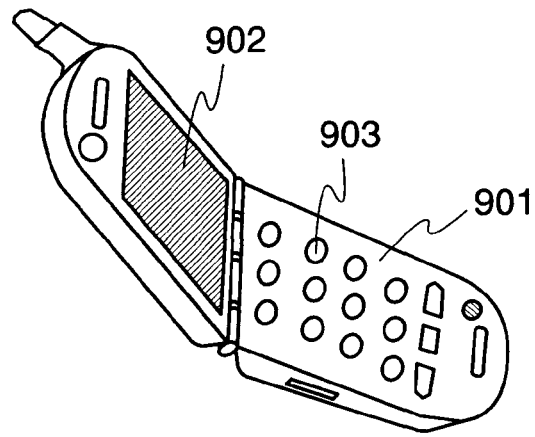
FIG. 14A is an external view of a mobile phone.

Specific modes of the electronic devices will be described suing FIGS. 14A to 14C. FIG. 14A is an external view illustrating a cellular phone 901. This cellular phone 901 includes a display portion 902, an operation switch 903, and the like. The display portion 902 can have excellent display quality with less display unevenness when the liquid crystal display device described using FIGS. 12A and 12B or the EL display device described using FIGS. 13A and 13B is applied to the display portion 902.

Figure 14B:
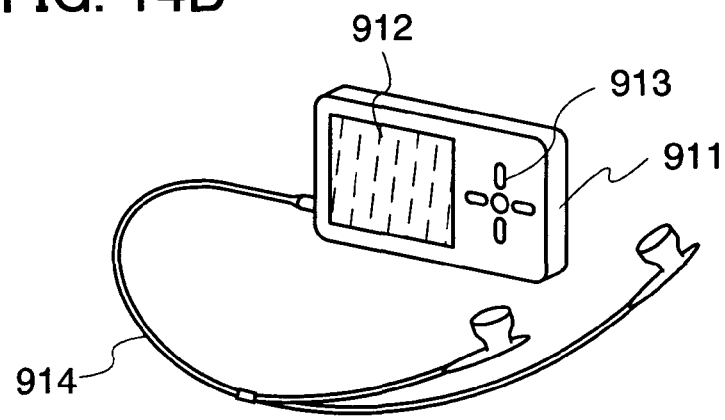
FIG. 14B is an external view of a digital player.

FIG. 14B is an external view illustrating a structure of a digital player 911. The digital player 911 includes a display portion 912, an operation portion 913, an earphone 914, and the like. The earphone 914 can be replaced by a headphone or a wireless earphone. When the liquid crystal display device described using FIGS. 12A and 12B or the EL display device described using FIGS. 13A and 13B is applied to the display portion 912, the display portion 912 can display high-definition images and a large amount of letter information even in the case where the screen size ranges from about 0.3 to 2 inches.

Figure 14C:
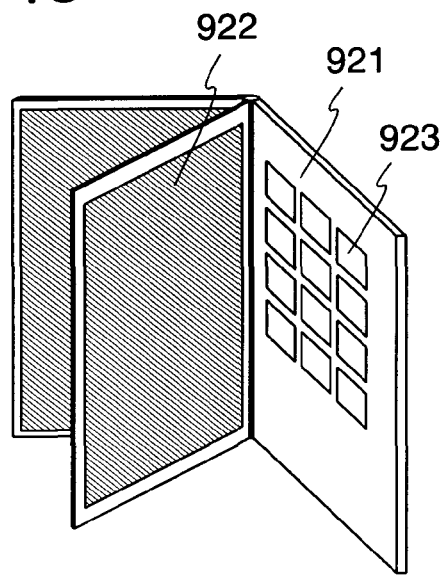
FIG. 14C is an external view of an electronic book reader.

FIG. 14C is an external view of an electronic book reader 921. This electronic book reader 921 includes a display portion 922 and an operation switch 923. The electronic book reader 921 may incorporate a modem or may incorporate the RFCPU shown in FIG. 10 so that information can be communicated wirelessly. The display portion 922 can perform high-definition display when the liquid crystal display device described using FIGS. 12A and 12B or the EL display device described using FIGS. 13A and 13B is applied to the display portion 922.

This application is based on Japanese Patent Application serial no. 2007-168666 filed with Japan Patent Office on Jun. 27, 2007 and Japanese Patent Application serial no. 2007-168960 filed with Japan Patent Office on Jun. 27, 2007, the entire contents of which are hereby incorporated by reference.

What is claimed is:

1. A manufacturing method of an SOI substrate, comprising:
    preparing a base substrate and a semiconductor substrate;
    generating plasma by exciting a source gas and irradiating the semiconductor substrate with an ion species contained in the plasma, whereby a damaged region is formed in the semiconductor substrate;
    forming a bonding layer over at least one of the base substrate and the semiconductor substrate;
    making the base substrate and the semiconductor substrate in close contact with each other with the bonding layer interposed therebetween so that a surface of the bonding layer and a surface in contact with the bonding layer are bonded, whereby the base substrate and the semiconductor substrate are attached to each other;
    dividing the semiconductor substrate in the damaged region by heating, so that a semiconductor layer separated from the semiconductor substrate is formed over the base substrate;
    forming a gettering site layer of a semiconductor containing a Group 18 element over the semiconductor layer after dividing the semiconductor substrate in the damaged region by heating;
    performing a heat treatment for gettering a metal element contained in the semiconductor layer into the gettering site layer; and
    removing the gettering site layer and the damaged region remaining on the semiconductor layer.

2. A manufacturing method of an SOI substrate, according to claim 1, wherein the gettering site layer includes one or more kinds of Group 18 elements selected from He, Ne, Ar, Kr, and Xe.

3. A manufacturing method of an SOI substrate, according to claim 1, wherein the gettering site layer is formed by forming a semiconductor film containing a Group 18 element by a CVD method using a source gas including at least a Group 18 element gas.

4. A manufacturing method of an SOI substrate, according to claim 1, wherein the gettering site layer is formed by forming a semiconductor film containing a Group 18 element by a sputtering method using the Group 18 element in a process gas.

5. A manufacturing method of an SOI substrate, according to claim 1, wherein the gettering site layer is formed by forming a semiconductor film by a CVD method or a sputtering method and adding a Group 18 element in the semiconductor film.

6. A manufacturing method of an SOI substrate, according to claim 1, wherein an ion doping apparatus is used for formation of the damaged region.

7. A manufacturing method of an SOI substrate, according to claim 1, wherein a hydrogen gas is used as the source gas for formation of the damaged region, the hydrogen gas is excited to generate plasma including $H^+$, $H_2^+$, and $H_3^+$ as ion species, and irradiation with an ion beam containing the $H^+$, $H_2^+$, and $H_3^+$ is performed, so that the damaged region is formed.

8. A manufacturing method of an SOI substrate, according to claim 1, wherein a helium gas or a halogen gas is used as the source gas for formation of the damaged region.

9. A manufacturing method of an SOI substrate, according to claim 1, wherein the base substrate is a glass substrate.

10. A manufacturing method of an SOI substrate, according to claim 1, wherein the damaged region is removed when the gettering site layer is removed.

11. A manufacturing method of a semiconductor device using an SOI substrate manufactured by the method according to claim 1, the manufacturing method of a semiconductor device, comprising:
   isolating the semiconductor layer of the SOI substrate for each element by etching; and
   manufacturing a TFT including the semiconductor layer isolated for each element.

12. A manufacturing method of an SOI substrate, comprising:
   preparing a base substrate and a semiconductor substrate;
   generating plasma by exciting a source gas and irradiating the semiconductor substrate with an ion species contained in the plasma, whereby a damaged region is formed in the semiconductor substrate;
   forming a bonding layer over at least one of the base substrate and the semiconductor substrate;
   making the base substrate and the semiconductor substrate in close contact with each other with the bonding layer interposed therebetween so that a surface of the bonding layer and a surface in contact with the bonding layer are bonded, whereby the base substrate and the semiconductor substrate are attached to each other;
   dividing the semiconductor substrate in the damaged region by heating, so that a semiconductor layer separated from the semiconductor substrate is formed over the base substrate;
   forming a gettering site layer of a semiconductor containing a Group 18 element over the semiconductor layer after dividing the semiconductor substrate in the damaged region by heating;
   performing a heat treatment for gettering a metal element contained in the semiconductor layer into the gettering site layer;
   removing the gettering site layer; and
   thinning the semiconductor layer.

13. A manufacturing method of an SOI substrate, according to claim 12, wherein the gettering site layer includes one or more kinds of Group 18 elements selected from He, Ne, Ar, Kr, and Xe.

14. A manufacturing method of an SOI substrate, according to claim 12, wherein the gettering site layer is formed by forming a semiconductor film containing a Group 18 element by a CVD method using a source gas including at least a Group 18 element gas.

15. A manufacturing method of an SOI substrate, according to claim 12, wherein the gettering site layer is formed by forming a semiconductor film containing a Group 18 element by a sputtering method using the Group 18 element in a process gas.

16. A manufacturing method of an SOI substrate, according to claim 12, wherein the gettering site layer is formed by forming a semiconductor film by a CVD method or a sputtering method and adding a Group 18 element in the semiconductor film.

17. A manufacturing method of an SOI substrate, according to claim 12, wherein an ion doping apparatus is used for formation of the damaged region.

18. A manufacturing method of an SOI substrate, according to claim 12, wherein a hydrogen gas is used as the source gas for formation of the damaged region, the hydrogen gas is excited to generate plasma including $H^+$, $H_2^+$, and $H_3^+$ as ion species, and irradiation with an ion beam containing the $H^+$, $H_2^+$, and $H_3^+$ is performed, so that the damaged region is formed.

19. A manufacturing method of an SOI substrate, according to claim 12, wherein a helium gas or a halogen gas is used as the source gas for formation of the damaged region.

20. A manufacturing method of an SOI substrate, according to claim 12, wherein the base substrate is a glass substrate.

21. A manufacturing method of a semiconductor device using an SOI substrate manufactured by the method according to claim 12, the manufacturing method of a semiconductor device, comprising:
   isolating the semiconductor layer of the SOI substrate for each element by etching; and
   manufacturing a TFT including the semiconductor layer isolated for each element.

22. A manufacturing method of an SOI substrate, comprising:
   preparing a base substrate and a semiconductor substrate;
   generating plasma by exciting a source gas and irradiating the semiconductor substrate with an ion species contained in the plasma, whereby a damaged region is formed in the semiconductor substrate;
   forming a bonding layer over at least one of the base substrate and the semiconductor substrate;
   making the base substrate and the semiconductor substrate in close contact with each other with the bonding layer interposed therebetween so that a surface of the bonding layer and a surface in contact with the bonding layer are bonded, whereby the base substrate and the semiconductor substrate are attached to each other;
   dividing the semiconductor substrate in the damaged region by heating, so that a semiconductor layer separated from the semiconductor substrate is formed over the base substrate;
   forming a gettering site layer of a semiconductor containing a Group 18 element over the semiconductor layer after dividing the semiconductor substrate in the damaged region by heating;
   performing a heat treatment for gettering a metal element contained in the semiconductor layer into the gettering site layer;
   removing the gettering site layer and the damaged region remaining on the semiconductor layer; and
   irradiating the semiconductor layer with a laser light.

23. A manufacturing method of an SOI substrate, according to claim 22, wherein the semiconductor layer is polished after irradiation with the laser light.

24. A manufacturing method of an SOI substrate, according to claim 22, wherein the gettering site layer includes one or more kinds of Group 18 elements selected from He, Ne, Ar, Kr, and Xe.

25. A manufacturing method of an SOI substrate, according to claim 22, wherein the gettering site layer is formed by forming a semiconductor film containing a Group 18 element by a CVD method using a source gas including at least a Group 18 element gas.

26. A manufacturing method of an SOI substrate, according to claim 22, wherein the gettering site layer is formed by forming a semiconductor film containing a Group 18 element by a sputtering method using the Group 18 element in a process gas.

27. A manufacturing method of an SOI substrate, according to claim 22, wherein the gettering site layer is formed by forming a semiconductor film by a CVD method or a sputtering method and adding a Group 18 element in the semiconductor film.

28. A manufacturing method of an SOI substrate, according to claim 22, wherein an ion doping apparatus is used for formation of the damaged region.

29. A manufacturing method of an SOI substrate, according to claim 22, wherein a hydrogen gas is used as the source gas for formation of the damaged region, the hydrogen gas is excited to generate plasma including $H^+$, $H_2^+$, and $H_3^+$ as ion species, and irradiation with an ion beam containing the $H^+$, $H_2^+$, and $H_3^+$ is performed, so that the damaged region is formed.

30. A manufacturing method of an SOI substrate, according to claim 22, wherein a helium gas or a halogen gas is used as the source gas for formation of the damaged region.

31. A manufacturing method of an SOI substrate, according to claim 22, wherein the base substrate is a glass substrate.

32. A manufacturing method of an SOI substrate, according to claim 22, wherein the damaged region is removed when the gettering site layer is removed.

33. A manufacturing method of a semiconductor device using an SOI substrate manufactured by the method according to claim 22, the manufacturing method of a semiconductor device, comprising:
   isolating the semiconductor layer of the SOI substrate for each element by etching; and
   manufacturing a TFT including the semiconductor layer isolated for each element.

34. A manufacturing method of an SOI substrate, comprising:
   preparing a base substrate and a semiconductor substrate;
   generating plasma by exciting a source gas and irradiating the semiconductor substrate with an ion species contained in the plasma, whereby a damaged region is formed in the semiconductor substrate;
   forming a bonding layer over at least one of the base substrate and the semiconductor substrate;
   making the base substrate and the semiconductor substrate in close contact with each other with the bonding layer interposed therebetween so that a surface of the bonding layer and a surface in contact with the bonding layer are bonded, whereby the base substrate and the semiconductor substrate are attached to each other;
   dividing the semiconductor substrate in the damaged region by heating, so that a semiconductor layer separated from the semiconductor substrate is formed over the base substrate;
   adding a Group 18 element into the semiconductor layer, whereby a gettering site region is formed in an upper portion of the semiconductor layer after dividing the semiconductor substrate in the damaged region by heating;
   performing a heat treatment for gettering a metal element contained in the semiconductor layer into the gettering site region; and
   removing the gettering site region from the semiconductor layer.

35. A manufacturing method of an SOI substrate, according to claim 34, wherein the gettering site region includes one or more kinds of Group 18 elements selected from He, Ne, Ar, Kr, and Xe.

36. A manufacturing method of an SOI substrate, according to claim 34, wherein an ion doping apparatus is used for formation of the damaged region.

37. A manufacturing method of an SOI substrate, according to claim 34, wherein a hydrogen gas is used as the source gas for formation of the damaged region, the hydrogen gas is excited to generate plasma including $H^+$, $H_2^+$, and $H_3^+$ as ion species, and irradiation with an ion beam containing the $H^+$, $H_2^+$, and $H_3^+$ is performed, so that the damaged region is formed.

38. A manufacturing method of an SOI substrate, according to claim 34, wherein a helium gas or a halogen gas is used as the source gas for formation of the damaged region.

39. A manufacturing method of an SOI substrate, according to claim 34, wherein the base substrate is a glass substrate.

40. A manufacturing method of a semiconductor device using an SOI substrate manufactured by the method according to claim 34, the manufacturing method of a semiconductor device, comprising:
   isolating the semiconductor layer of the SOI substrate for each element by etching; and
   manufacturing a TFT including the semiconductor layer isolated for each element.

41. A manufacturing method of an SOI substrate, comprising:
   preparing a base substrate and a semiconductor substrate;
   generating plasma by exciting a source gas and irradiating the semiconductor substrate with an ion species contained in the plasma, whereby a damaged region is formed in the semiconductor substrate;
   forming a bonding layer over at least one of the base substrate and the semiconductor substrate;
   making the base substrate and the semiconductor substrate in close contact with each other with the bonding layer interposed therebetween so that a surface of the bonding layer and a surface in contact with the bonding layer are bonded, whereby the base substrate and the semiconductor substrate are attached to each other;
   dividing the semiconductor substrate in the damaged region by heating, so that a semiconductor layer separated from the semiconductor substrate is formed over the base substrate;
   adding a Group 18 element into the semiconductor layer, whereby a gettering site region is formed in an upper portion of the semiconductor layer after dividing the semiconductor substrate in the damaged region by heating;
   performing a heat treatment for gettering a metal element contained in the semiconductor layer into the gettering site region;
   removing the gettering site region from the semiconductor layer; and
   thinning the semiconductor layer after the gettering site region is removed.

42. A manufacturing method of an SOI substrate, according to claim 41, wherein the gettering site region includes one or more kinds of Group 18 elements selected from He, Ne, Ar, Kr, and Xe.

43. A manufacturing method of an SOI substrate, according to claim 41, wherein an ion doping apparatus is used for formation of the damaged region.

44. A manufacturing method of an SOI substrate, according to claim 41, wherein a hydrogen gas is used as the source gas for formation of the damaged region, the hydrogen gas is excited to generate plasma including $H^+$, $H_2^+$, and $H_3^+$ as ion species, and irradiation with an ion beam containing the H$^+$, H$_2^+$, and H$_3^+$ is performed, so that the damaged region is formed.

45. A manufacturing method of an SOI substrate, according to claim 41, wherein a helium gas or a halogen gas is used as the source gas for formation of the damaged region.

46. A manufacturing method of an SOI substrate, according to claim 41, wherein the base substrate is a glass substrate.

47. A manufacturing method of a semiconductor device using an SOI substrate manufactured by the method according to claim 41, the manufacturing method of a semiconductor device, comprising:
  isolating the semiconductor layer of the SOI substrate for each element by etching; and
  manufacturing a TFT including the semiconductor layer isolated for each element.

48. A manufacturing method of an SOI substrate, comprising:
  preparing a base substrate and a semiconductor substrate;
  generating plasma by exciting a source gas and irradiating the semiconductor substrate with an ion species contained in the plasma, whereby a damaged region is formed in the semiconductor substrate;
  forming a bonding layer over at least one of the base substrate and the semiconductor substrate;
  making the base substrate and the semiconductor substrate in close contact with each other with the bonding layer interposed therebetween so that a surface of the bonding layer and a surface in contact with the bonding layer are bonded, whereby the base substrate and the semiconductor substrate are attached to each other;
  dividing the semiconductor substrate in the damaged region by heating, so that a semiconductor layer separated from the semiconductor substrate is formed over the base substrate;
  adding a Group 18 element into the semiconductor layer, whereby a gettering site region is formed in an upper portion of the semiconductor layer after dividing the semiconductor substrate in the damaged region by heating;
  performing a heat treatment for gettering a metal element contained in the semiconductor layer into the gettering site region;
  removing the gettering site region from the semiconductor layer; and
  irradiating the semiconductor layer with a laser light.

49. A manufacturing method of an SOI substrate, according to claim 48, wherein the gettering site region includes one or more kinds of Group 18 elements selected from He, Ne, Ar, Kr, and Xe.

50. A manufacturing method of an SOI substrate, according to claim 48, wherein an ion doping apparatus is used for formation of the damaged region.

51. A manufacturing method of an SOI substrate, according to claim 48, wherein a hydrogen gas is used as the source gas for formation of the damaged region, the hydrogen gas is excited to generate plasma including H$^+$, H$_2^+$, and H$_3^+$ as ion species, and irradiation with an ion beam containing the H$^+$, H$_2^+$, and H$_3^+$ is performed, so that the damaged region is formed.

52. A manufacturing method of an SOI substrate, according to claim 48, wherein a helium gas or a halogen gas is used as the source gas for formation of the damaged region.

53. A manufacturing method of an SOI substrate, according to claim 48, wherein the base substrate is a glass substrate.

54. A manufacturing method of a semiconductor device using an SOI substrate manufactured by the method according to claim 48, the manufacturing method of a semiconductor device, comprising:
  isolating the semiconductor layer of the SOI substrate for each element by etching; and
  manufacturing a TFT including the semiconductor layer isolated for each element.

* * * * *